(12) United States Patent
Kojima et al.

(10) Patent No.: US 6,806,505 B2
(45) Date of Patent: Oct. 19, 2004

(54) LIGHT EMITTING DEVICE AND PROCESS FOR PRODUCING THE SAME

(75) Inventors: Shigeru Kojima, Kanagawa (JP); Katsuya Shirai, Kanagawa (JP); Yoshifumi Mori, Chiba (JP); Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/180,827

(22) Filed: Jun. 26, 2002

(65) Prior Publication Data

US 2002/0163005 A1 Nov. 7, 2002

Related U.S. Application Data

(62) Division of application No. 09/358,412, filed on Jul. 22, 1999, now abandoned.

(30) Foreign Application Priority Data

Jul. 23, 1998 (JP) ............................................. 10-208453
Mar. 29, 1999 (JP) ............................................. 11-086652

(51) Int. Cl.[7] .............................................. H01L 29/67
(52) U.S. Cl. ........................... 257/86; 257/94; 257/101; 257/79
(58) Field of Search ............................. 257/86, 79, 94, 257/101, 50, 51, 90, 87, 103, 13, 40; 372/43

(56) References Cited

U.S. PATENT DOCUMENTS

| | | | | |
|---|---|---|---|---|
| 4,081,763 A | * | 3/1978 | Vlasenko et al. | ............ 331/94.5 |
| 5,332,910 A | | 7/1994 | Haraguchi et al. | |
| 5,484,922 A | * | 1/1996 | Moore et al. | ................... 546/7 |
| 5,672,938 A | | 9/1997 | Jones | |
| 5,784,399 A | * | 7/1998 | Sun | ............................... 372/50 |
| 6,063,643 A | * | 5/2000 | Dutta | ........................... 438/39 |
| 6,121,634 A | | 9/2000 | Saito et al. | |
| 6,157,047 A | | 12/2000 | Fujita et al. | |
| 6,236,060 B1 | | 5/2001 | Chan et al. | |

FOREIGN PATENT DOCUMENTS

| | | |
|---|---|---|
| JP | 02-216877 | 8/1990 |
| JP | 04-112584 | 4/1992 |

* cited by examiner

*Primary Examiner*—Jerome Jackson
*Assistant Examiner*—Joseph Nguyen
(74) *Attorney, Agent, or Firm*—Sonnenschein, Nath & Rosenthal LLP

(57) ABSTRACT

There is provided a light emitting device and a process for producing the same in that the light emission efficiency is high, the range of selection of the material is broad, and a device array of a large area can be formed. On a substrate 11 comprising quartz glass, an n-type clad layer 12 comprising a non-single crystal body of n-type AlGaN, a light emitting layer 13 containing plural microcrystals 13a comprising ZnO, and a p-type clad layer 14 comprising a non-single crystal body of p-type BN are laminated in this order. Between the n-type clad layer 12 and the p-type clad layer 14, an insulating layer 15 is formed to fill the gap among the microcrystals 13a to prevent a leaking electric current. The insulating layer 15 is formed by oxidizing the surface of the n-type clad layer 12. Because the light emitting layer 13 contains the plural microcrystals 13a having an increased crystallinity, the light emission efficiency is increased, the range of selection of the materials of the light emitting layer 13, the n-type clad layer 12, the p-type clad layer 14 and the substrate 11 is broadened, and a device array of a large area can be formed.

9 Claims, 16 Drawing Sheets

US 6,806,505 B2

LIGHT EMITTING DEVICE AND PROCESS FOR PRODUCING THE SAME

RELATED APPLICATION DATA

This application is a divisional of copending application Ser. No. 09/358,412 filed Jul. 22, 1999 now abandoned. The present and foregoing applications claim priority to Japanese application No. P11-086652 filed Mar. 29, 1999, and to Japanese application No. P10-208453 filed Jul. 23, 1998, each of which is incorporated herein by reference to the extent permitted by law.

BACKGROUND OF THE INVENTION

1. Field of the Invention

The present invention relates to a light emitting device using microcrystals, and a process for producing the same.

2. Description of the Related Art

A light emitting device using a semiconductor, such as GaAs, a GaAsP mixed crystal, a GaAlAs mixed crystal, GaP and the like, has conventionally been developed. The light emitting device comprises a substrate having laminated thereon an n-type semiconductor layer, a light emitting layer and a p-type semiconductor layer in this order, and when a voltage is applied in the normal bias direction, light emission occurs by recombination of an electron and a hole in the light emitting layer. Conventionally, the n-type semiconductor layer, the light emitting layer and the p-type semiconductor layer each are constituted with a single crystal, and are formed by epitaxial growth on the substrate. Therefore, the substrate is also constituted with a single crystal.

However, in the conventional light emitting device, because the n-type semiconductor layer, the light emitting layer and the p-type semiconductor layer each are constituted with a single crystal, lattice matching with the substrate and matching of the crystalline structures are necessary to obtain a good crystal. Furthermore, the conditions on conducting the epitaxial growth are severely restricted, and the epitaxial growth should be conducted at a high temperature to decrease defects. Accordingly, a material constituting the substrate is considerably restricted, and the freedom of selecting the materials is small. Therefore, quartz and glass cannot be used as the substrate, and there is a problem in that a device array of a large area cannot be produced.

Furthermore, the materials constituting the light emitting layer, the n-type semiconductor layer and the p-type semiconductor layer are considerably restricted by the material of the substrate, and the freedom of selecting the materials is small. Accordingly, there is also a problem in that the wavelength of emitting light is restricted. Furthermore, there is also a problem in that defects cannot be completely avoided even though such measures for reducing defects have been conducted, and the defects function as a non-light emission center to cause reduction or deterioration of the light emission efficiency.

SUMMARY OF THE INVENTION

The invention has been made in view of the problems, and an object thereof is to provide a light emitting device and a process for producing the same, that has a high light emission efficiency, a wide range of selection of the materials, and capability of forming a device array of a large area.

A light emitting device of the invention comprises a first conductive type layer, a second conductive type layer, and a microcrystalline layer comprising plural microcrystals comprising a semiconductor, formed between the first conductive type layer and the second conductive type layer.

Another light emitting device of the invention comprises a first conductive type clad layer, a second conductive type clad layer, a light emitting layer containing plural microcrystals, formed between the first conductive type clad layer and the second conductive type clad layer, and an insulating layer having a thickness thinner than the light emitting layer, formed between the first conductive type clad layer and the second conductive type clad layer.

A process for producing a light emitting device of the invention comprises a step of forming a first conductive type layer; a step of forming a microcrystalline layer containing plural microcrystals comprising a semiconductor on the first conductive type layer; and a step of forming a second conductive type layer on the first conductive type layer through the microcrystalline layer.

Another process for producing a light emitting device of the invention comprises a step of forming a first conductive type clad layer; a step of forming a light emitting layer comprising plural microcrystals, on the first conductive type clad layer; a step of forming an insulating layer having a thickness thinner than the light emitting layer, on the first conductive type clad layer; and a step of forming a second conductive type clad layer on the first conductive type clad layer through the light emitting layer and said insulating layer.

In the light emitting device according to the invention, when a voltage is applied between the first conductive type layer and the second conductive type layer, an electric current is injected to the microcrystals of the microcrystalline layer to occur emission of light. The microcrystals have substantially no defect, and emission of light occurs with a high efficiency.

In the another light emitting device according to the invention, when a voltage is applied between the first conductive type clad layer and the second conductive type clad layer, an electric current is injected to the microcrystals of the light emitting layer to occur emission of light. The microcrystals have substantially no defect, and emission of light occurs with a high efficiency. Because the insulating layer is formed between the first conductive type clad layer and the second conductive type clad layer, a leaking electric current between the first conductive type clad layer and the second conductive type clad layer is decreased, and the electric current flows via the respective microcrystals.

In the process for producing a light emitting device according to the invention, after the first conductive type layer is formed, the microcrystalline layer is formed, and the second conductive type layer is formed through the microcrystalline layer.

In the another process for producing a light emitting device according to the invention, after the first conductive type clad layer is formed, the microcrystalline layer is formed, and the insulating layer is formed. Thereafter, the second conductive type layer is formed through the microcrystalline layer and the insulating layer.

DESCRIPTION OF THE PREFERRED EMBODIMENTS

Embodiments of the invention will be described in detail with reference to the drawings.

(First Embodiment)

Figure 1:
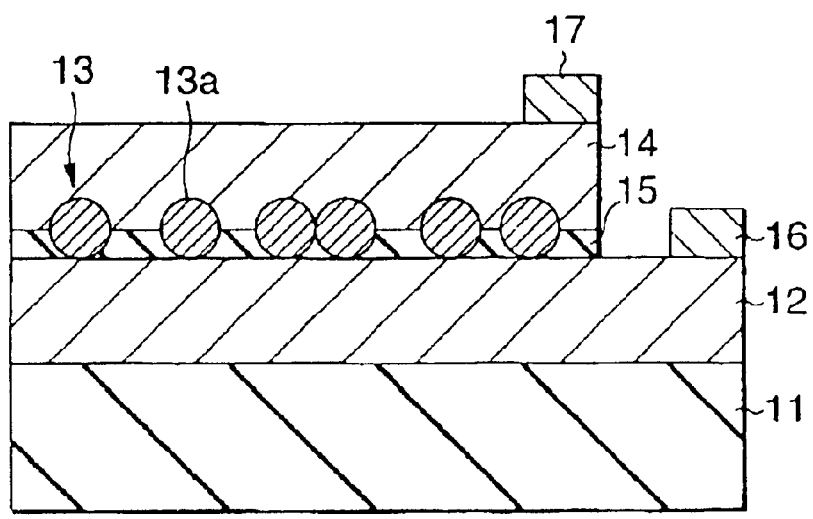
FIG. 1 is a cross sectional view showing the constitution of the light emitting diode of the first embodiment of the invention.

FIG. 1 shows a cross sectional structure of a light emitting diode (LED), which is a light emitting device of the first embodiment of the invention. The light emitting diode comprises a substrate 11 having laminated on one surface thereof a first conductive type clad layer 12 as the first conductive type layer, a light emitting layer 13 as the microcrystalline layer, and a second conductive type clad layer 14 as the second conductive type layer in this order. In this embodiment, the first conductive type is an n-type, and the second conductive type is a p-type.

The substrate 11 has, for example, a thickness in the lamination direction (hereinafter simply referred to as a thickness) of 0.5 mm and comprises a transparent material, such as glass, e.g., quartz glass, silicate glass and the like, crystalline quartz, sapphire or the like. By constituting the substrate 11 with a transparent material, it is preferred since light can be taken out from the side of the substrate 11. The substrate 11 may comprise an amorphous material other than glass, as well as the transparent material. By constituting with an amorphous material, it is preferred since the area of the substrate 11 can be easily enlarged.

The first conductive type clad layer 12 has, for example, a thickness of 1 $\mu$m and comprises n-type AlGaN or n-type GaN, to which an n-type impurity such as silicon (Si) is added. The first conductive type clad layer 12 comprises a non-single crystal, such as a polycrystalline body thereof, an amorphous body thereof, a complex body of the polycrystalline body and the amorphous body, and the like. The composition of aluminum in the n-type AlGaN is, for example, 50% by mol or less.

The light emitting layer 13 contains, for example, plural microcrystals 13a comprising ZnO. The microcrystals 13a herein comprise a fine particle comprising a single crystal or polycrystals that can emit light. The crystalline particle diameter of the microcrystals 13a (i.e., the crystalline particle diameter of one single crystal) is preferably 100 nm or less. This is because a crystal having no defect can be obtained with the diameter of 100 nm or less. The microcrystals 13a form substantially one layer in the laminated direction.

The second conductive type clad layer 14 has, for example, a thickness of 0.5 $\mu$m and comprises a non-single crystal body of p-type BN, to which a p-type impurity such as magnesium (Mg) is added, a non-single crystal body of p-type AlN, to which a p-type impurity such as zinc (Zn) is added. That is, in this embodiment, the first conductive type clad layer 12 and the second conductive type clad layer 14 each comprise an inorganic semiconductor containing nitrogen (N), and the light emitting layer 13 comprises an inorganic semiconductor containing oxygen (O).

Between the first conductive type clad layer 12 and the second conductive type clad layer 14, an insulating layer 15 is formed to fill the gap among the microcrystals 13a of the light emitting layer 13 to prevent the contact of the first conductive type clad layer 12 and the second conductive type clad layer 14. The insulating layer has, for example, a thickness smaller than the particle diameter of the microcrystals 13a of the light emitting layer 13 and comprises a compound of aluminum (Al), gallium (Ga) and oxygen, or a compound of gallium and oxygen.

A first electrode 16 is formed on the first conductive type clad layer 12 on the side opposite to the substrate 11. The first electrode 16 has, for example, a structure, which is obtained by laminating a titanium (Ti) layer, an aluminum layer, a platinum (Pt) layer and a gold (Au) layer in this order from the side of the first conductive type clad layer 12, followed by subjecting to a heat treatment to make into an alloy, and electrically connected to the first conductive type clad layer 12. Furthermore, a second electrode 17 is formed on the second conductive type clad layer 14 on the side opposite to the substrate 11. The second electrode 17 has, for example, a structure, which is obtained by laminating a nickel (Ni) layer, a platinum layer and a gold layer in this order from the side of the second conductive type clad layer 14, followed by subjecting to a heat treatment to make into an alloy, and electrically connected to the second conductive type clad layer 14. Accordingly, the first electrode 16 functions as an n-side electrode, and the second electrode 17 functions as a p-side electrode.

Figure 2:
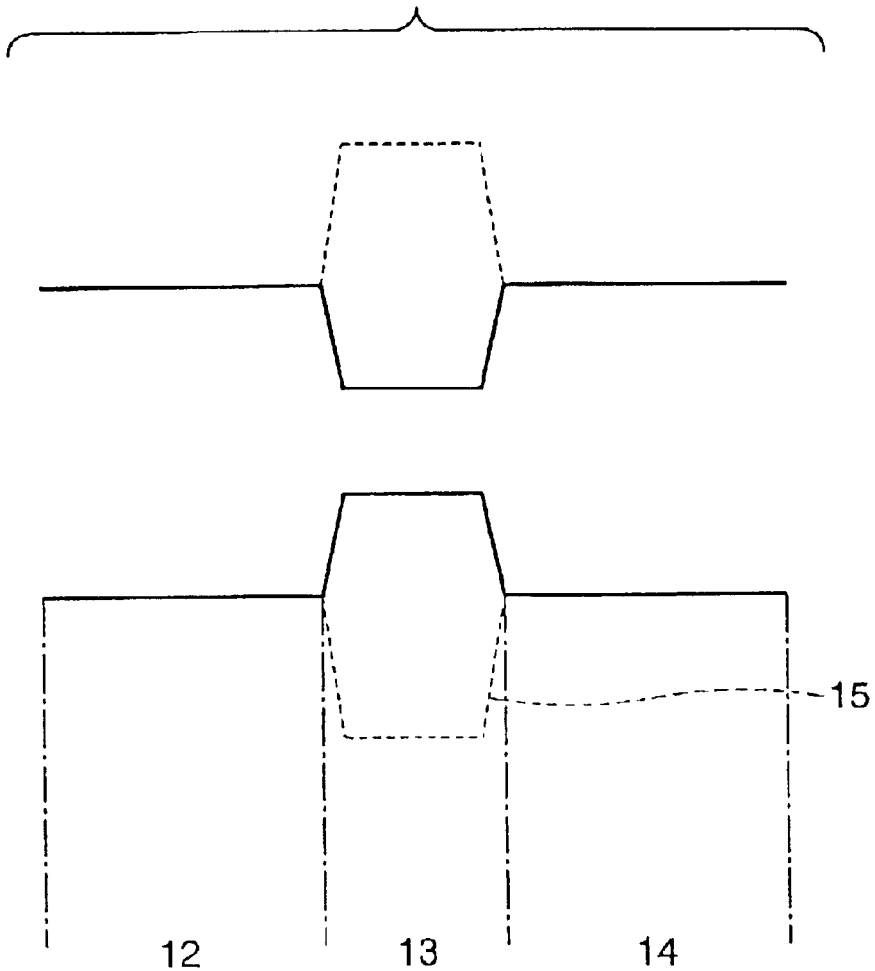
FIG. 2 is a band gap structure diagram of the light emitting diode shown in FIG. 1.

FIG. 2 shows a band gap structure of the light emitting diode. In FIG. 2, the solid lines show the band gaps of the first conductive type clad layer 12, the light emitting layer 13 and the second conductive type clad layer 14, respectively, and the broken line shows the band gap of the insulating layer 15. As shown herein, the band gap of the light emitting layer 13 is smaller than the band gaps of the first conductive type clad layer 12 and the second conductive type clad layer 14. The band gap of the insulating layer 15 is larger than the band gap of the light emitting layer 13. That is, between the second conductive type clad layer 14 and the first conductive type clad layer 12, an electric current flows through the light emitting layer 13.

The band gaps of the first conductive type clad layer 12, the second conductive type clad layer 14 and the insulating layer 15 are determined by the materials constituting them, and the band gap of the light emitting layer 13 (i.e., the microcrystals 13a) is determined by the material constituting the microcrystals 13a and the particle diameter thereof. There is a tendency in that the band gap of the light emitting layer 13 is broadened with the particle diameter of the microcrystals 13a being smaller. The wavelength of emitting light of the light emitting diode is determined by the band gap of the light emitting layer 13. Herein, the band gap of the light emitting layer 13 is about 3.3 eV, and the wavelength of emitting light is about 380 nm.

The light emitting diode having the structure herein can be produced by the following manner.

FIG. 3 shows the production steps. As shown in FIG. 3(A), a substrate 11 comprising quartz glass or the like is prepared, and a first conductive type clad layer 12 comprising a non-single crystal body of n-type AlGaN or a non-single crystal body of n-type GaN is formed on one surface thereof by using a sputtering method, a CVD (chemical vapor deposition) method, a molecular beam epitaxy (MBE) method or a laser accumulation method. At this time, the temperature of the substrate 11 is made 600° C. or less. This is because the temperature may not be so high since the first conductive type clad layer 12 is constituted with a non-single crystal body, and accordingly the substrate 11 can endure the temperature even when it is constituted with an amorphous body such as glass or the like. Subsequently, in the case where the activation of the impurity in the first conductive type clad layer 12 is insufficient, the activation thereof is conducted by, for example, a laser annealing method.

Figure 3A:
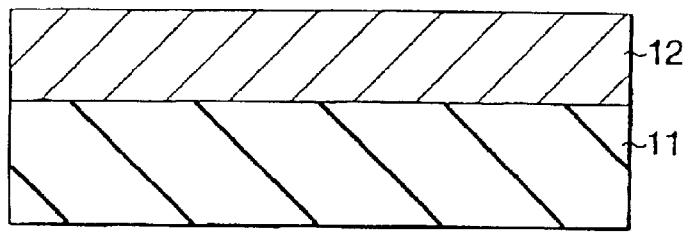
FIGS. 3(A) to (D) are cross sectional views showing the production steps of the light emitting diode shown in FIG. 1.
Figure 3B:
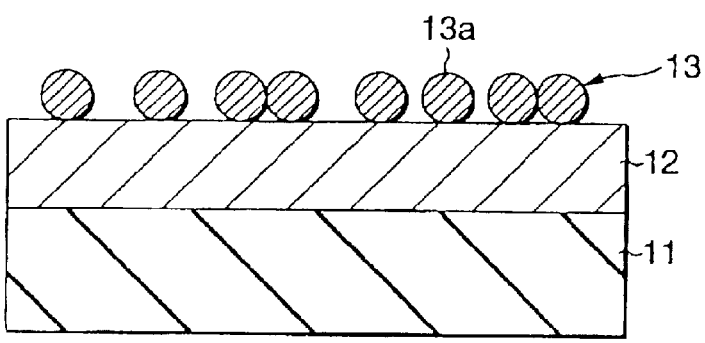

Thereafter, as shown in FIG. 3(B), plural microcrystals 13a comprising ZnO are adhered by an electrodeposition method, an MBE method or a laser accumulation method, or plural microcrystals 13a comprising ZnO dispersed in a solvent are coated, on the first conductive type clad layer 12 on the side opposite to the substrate 11, so as to form a light emitting layer 13. At this time, the particle diameter of the microcrystals 13a, the coating ratio of the microcrystals 13a on the first conductive type clad layer 12, and the laminated number of the microcrystals 13a (i.e., the thickness of the light emitting layer 13) are controlled by adjusting the various conditions. Specifically, in the electrodeposition method, they are controlled by adjusting the purity of the solution, the temperature of the solution, the applied voltage, the treating time and the like. In the MBE method and the laser accumulation method, they are controlled by adjusting the temperature of the substrate 11, the pressure of the atmospheric gas, the vapor deposition rate and the like. In the method where the microcrystals 13a dispersed in a solvent are coated, they are controlled by adjusting the kind, viscosity and concentration of the solvent and the like.

Figure 3C:
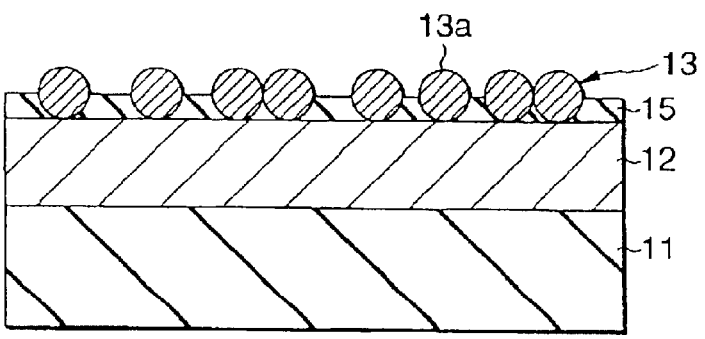

After forming the light emitting layer 13, a heat treatment in an atmosphere containing oxygen, such as an oxygen plasma treatment or the like, is conducted as shown in FIG. 3(C). Accordingly, oxygen holes present in the microcrystals 13a of the light emitting layer 13 are complemented to increase the crystallinity, and the surface of the first conductive type clad layer 12 that is not in contact with the microcrystals 13a is oxidized to form an insulating film 15 comprising a compound of aluminum, gallium and oxygen or a compound of gallium and oxygen. Thereafter, it is preferred to further conduct a heat treatment in an atmosphere containing hydrogen, such as a hydrogen plasma treatment or the like. This is because by this treatment, the oxygen holes remaining in the microcrystals 13a of the light emitting layer 13 can be complemented to further improve the crystallinity thereof. That is, by the treatments by using oxygen and hydrogen, emission of green light (having a wavelength of 510 nm) by the donor-acceptor recombination (T. Sekiguchi et al., Jpn. J. Appl. Phys., 36, L289 (1997)) contributed by the donor formed by the oxygen holes is inactivated.

Figure 3D:
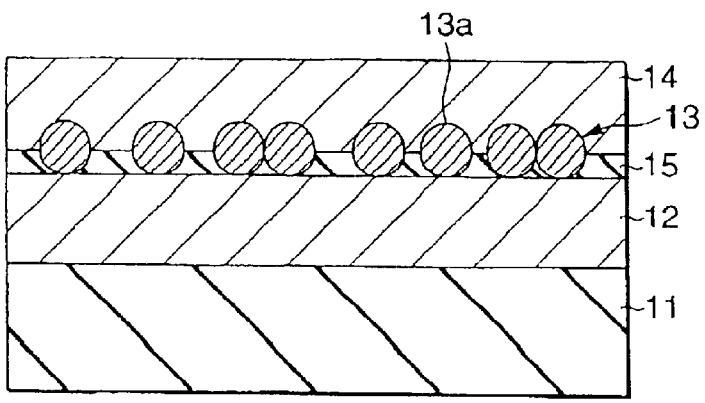

After conducting the heat treatments in an atmosphere containing oxygen and an atmosphere containing hydrogen, as shown in FIG. 3(D), a second conductive type clad layer 14 comprising a non-single crystal body of p-type BN or a non-single crystal body of p-type AlN is formed on the first conductive type clad layer 12 on the side opposite to the substrate 11 through the light emitting layer 13 and the insulating layer 15 by, for example, a sputtering method, a CVD method, an MBE method or a laser accumulation method. At this time, the temperature of the substrate 11 is made 600° C. or less. This is because the temperature may not be so high since the second conductive type clad layer 14 is also constituted with a non-single single crystal body, and accordingly the substrate 11 can endure the temperature even when it is constituted with glass or the like. Thereafter, in the case where the activation of the impurity in the second conductive type clad layer 14 is insufficient, the activation thereof is conducted by, for example, a laser annealing method.

After forming the second conductive type clad layer 14, the second conductive type clad layer 14, the light emitting layer 13 and the insulating layer 15 are selectively removed in this order corresponding to the position, at which the first electrode 16 is formed, by using a lithography technique, so as to expose a part of the first conductive type clad layer 12. At this time, a part of the first conductive type clad layer 12 may be selectively removed. After exposing the first conductive type clad layer 12, a resist film not shown in the figure is formed on the whole surface of the second conductive type clad layer 14 and the first conductive type clad layer 12 exposed by etching, and an opening is formed on the position, at which an n-side electrode 16 is formed. Thereafter, on the whole surface thereof, a titanium layer, an aluminum layer, a platinum layer and a gold layer, for example, are vapor deposited in this order by a vapor deposition method, and a first electrode 16 is formed by removing the resist film and the metallic layers formed thereon (lift-off). A second electrode 17 is selectively formed, for example, in the similar manner as the first electrode 16 by vapor depositing a nickel layer, a platinum layer and a gold layer in this order. Thereafter, a heat treatment is conducted to make the second electrode 17 and the first electrode 16 into an alloy. Accordingly, the light emitting diode shown in FIG. 1 is formed.

The light emitting diode thus produced functions as follows.

In the light emitting diode, when a prescribed voltage is applied between the first electrode 16 and the second electrode 17, an electric current is injected to the microcrystals 13a of the light emitting layer 13, and light emission occurs by the electron-hole recombination in the respective microcrystals 13a. The microcrystals 13a have substantially no defects and emit light with a high efficiency. The wavelength of the emitting light is determined by the band gap of the light emitting layer 13, which is about 380 nm herein. Because the insulating layer 15 is formed between the second conductive type clad layer 14 and the first conductive clad layer 12, the leaking electric current between the second conductive type clad layer 14 and the first conductive clad layer 12 is decreased, and the electric current flows through the microcrystals 13a. Therefore, the electrons and the holes are effectively injected to the microcrystals 13a.

The light emitting diode is used as a light source of an illumination, a display, a sterilization lamp or the like.

According to the light emitting diode of this embodiment, because the light emitting layer 13 is constituted with the plural microcrystals 13a, the crystallinity of the light emitting layer 13 can be increased, so that the light emission efficiency is increased, and the service life can be prolonged. Because it is not necessary to consider the lattice matching with the substrate 11 or the like, the material can be arbitrarily selected depending on the wavelength of the emitting light or the like. Furthermore, because the band gap is broadened with the particle diameter being smaller by the particle size effect, the wavelength of the emitting light can be a short wavelength, and for example, light emission in an ultraviolet region can be obtained by constituting the microcrystals 13a with ZnO. Accordingly, it can be used as a light source of a sterilization lamp or the like.

Moreover, since the first conductive type clad layer 12 and the second conductive type clad layer 14 need not be constituted with a single crystal, the range of selection of the material therefor is broadened, and they may be constituted with a non-single crystal body, which can be formed at a low temperature. Accordingly, the range of selection of the material constituting the substrate 11 is broadened, and for example, the substrate 11 can be constituted with an amorphous body such as glass or the like. Therefore, a device array of a large area can be formed.

Furthermore, according to the light emitting diode, because the insulating layer 15 is formed among the microcrystals 13a of the light emitting layer 13, the leaking electric current between the second conductive type clad layer 14 and the first conductive type clad layer 12 can be decreased, and the electrons and the holes can be effectively injected to the microcrystals 13a. Therefore, the light emission efficiency can be increased.

Moreover, according to the process for producing a light emitting diode of this embodiment, because the first conductive type clad layer 12 and the light emitting layer 13 are laminated in this order on the substrate 11, and after forming the insulating layer 15, the second conductive type clad layer 14 is then formed, the light emitting diode of this embodiment can be easily produced, and the light emitting diode of this embodiment can be realized. In particular, because the heat treatment in an atmosphere containing oxygen is conducted after forming the light emitting layer 13, the insulating layer 15 is easily formed, and the crystallinity of the microcrystals 13a can also be increased. Furthermore, because after conducting the heat treatment in an atmosphere containing oxygen, the heat treatment in an atmosphere containing hydrogen is further conducted, the crystallinity of the microcrystals 13a can further be increased.

(Second Embodiment)

Figure 4:
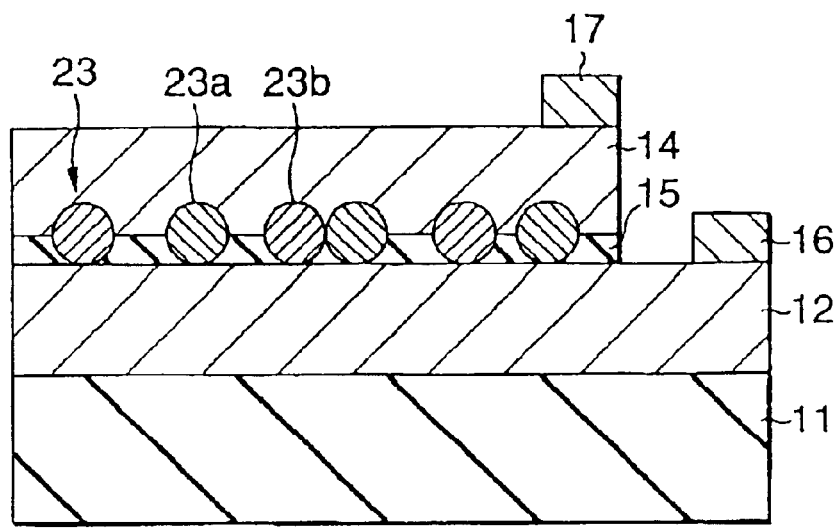
FIG. 4 is a cross sectional view showing the constitution of the light emitting diode of the second embodiment of the invention.

FIG. 4 is a cross sectional view showing the constitution of a light emitting diode of the second embodiment of the invention. This light emitting diode has the same constitution as the first embodiment except that the constitution of a light emitting layer 23 is different, and can be produced in the similar manner. It is used in the similar manner as the first embodiment. Therefore, the same symbols are attached to the same constitutional components, and the symbols, in which the tens digit is changed to "2", are attached to the corresponding constitutional components, so that the detailed descriptions for the same parts are omitted.

The light emitting layer 23, for example, contains plural microcrystals 23a comprising ZnO and also contains plural microcrystals 23b comprising $TiO_2$. That is, the light emitting layer 23 contains two kinds of microcrystals 23a and 23b each comprising different semiconductors, and the light emitting layer 23 has two band gaps. The band gap of the microcrystals 23a comprising ZnO is about 3.3 eV, and the band gap of the microcrystals 23b comprising $TiO_2$ is about 2.9 eV.

In this light emitting diode, when a prescribed voltage is applied between the first electrode 16 and the second electrode 17, an electric current is injected to the microcrystals 23a and 23b of the light emitting layer 23, and emission of light occurs in each of the microcrystals 23a and 23b. Because the microcrystals 23a and the microcrystals 23b are constituted with different semiconductors herein, the band gaps thereof are different from each other. Therefore, they emit light with different wavelengths (about 380 nm and about 430 nm). The microcrystals 23b comprising $TiO_2$ emit light of 530 nm at a low temperature when a large Stokes' shift is formed (N. Hosaka et al., J. Luminescence 72–74, 874 (1997)).

According to this embodiment, in addition to the effect described for the first embodiment, an effect is obtained in that two kinds of light having wavelengths different from each other can be obtained because the microcrystals 23a and 23b in the light emitting layer 23 are constituted with different semiconductors.

In the second embodiment described above, while the case where the light emitting layer 23 contains two kinds of microcrystals 23a and 23b has been described, the light emitting layer 23 may contain plural microcrystals of three or more kinds of different semiconductors. As the material for constituting the microcrystals, in addition to ZnO and $TiO_2$, for example, ZnSe, CdS, CdSe, InN, a GaAsP mixed crystal, (α-SiC and the like may be used. By increasing the number of kinds of the microcrystals, the number of the wavelengths of the emitting light can be accordingly increased.

(Third Embodiment)

Figure 5:
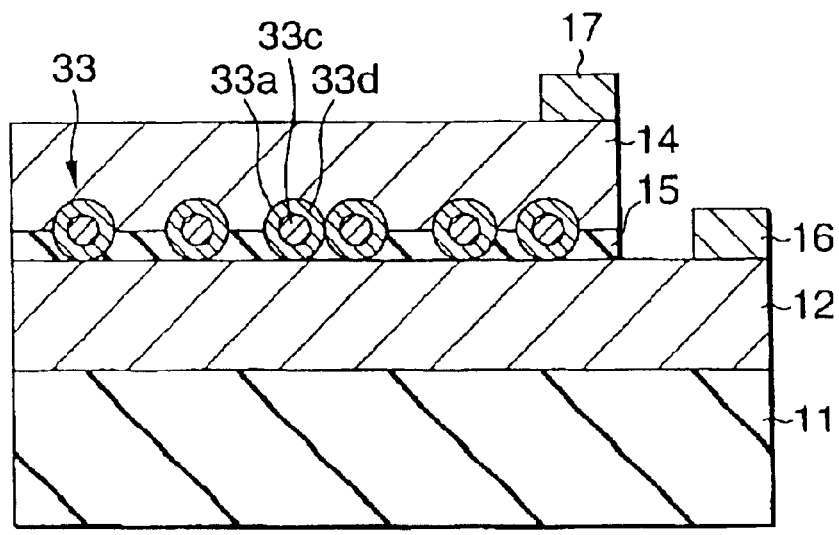
FIG. 5 is a cross sectional view showing the constitution of the light emitting diode of the third embodiment of the invention.

FIG. 5 is a cross sectional view showing the constitution of a light emitting diode of the third embodiment of the invention. This light emitting diode has the same constitution as the first embodiment except that the constitution of a light emitting layer 33 is different, and can be produced in the similar manner. It is used in the similar manner as the first embodiment. Therefore, the same symbols are attached to the same constitutional components, and the symbols, in which the tens digit is changed to "3", are attached to the corresponding constitutional components, so that the detailed descriptions for the same parts are omitted.

The light emitting layer 33 contains, for example, plural microcrystals 33a having a layer structure comprising an inner layer 33c and a surface layer 33d formed on the surface thereof. The inner layer 33c functions as a light emitting part, and the surface layer 33d is for increasing the light emission efficiency of the inner layer 33c. The material for constituting the surface layer 33d is selected in such a manner that the band gap of the surface layer 33d is larger than the inner layer 33c but smaller than the first conductive type clad layer 12 and the second conductive type clad layer 14. For example, the inner layer 33c is constituted with ZnO added with no impurity, and the surface layer 33d is constituted with Mg-doped ZnO to which magnesium is added. Alternatively, the inner layer 33c is constituted with CdS added with no impurity, and the surface layer 53d is constituted with ZnS added with no impurity.

Figure 6:
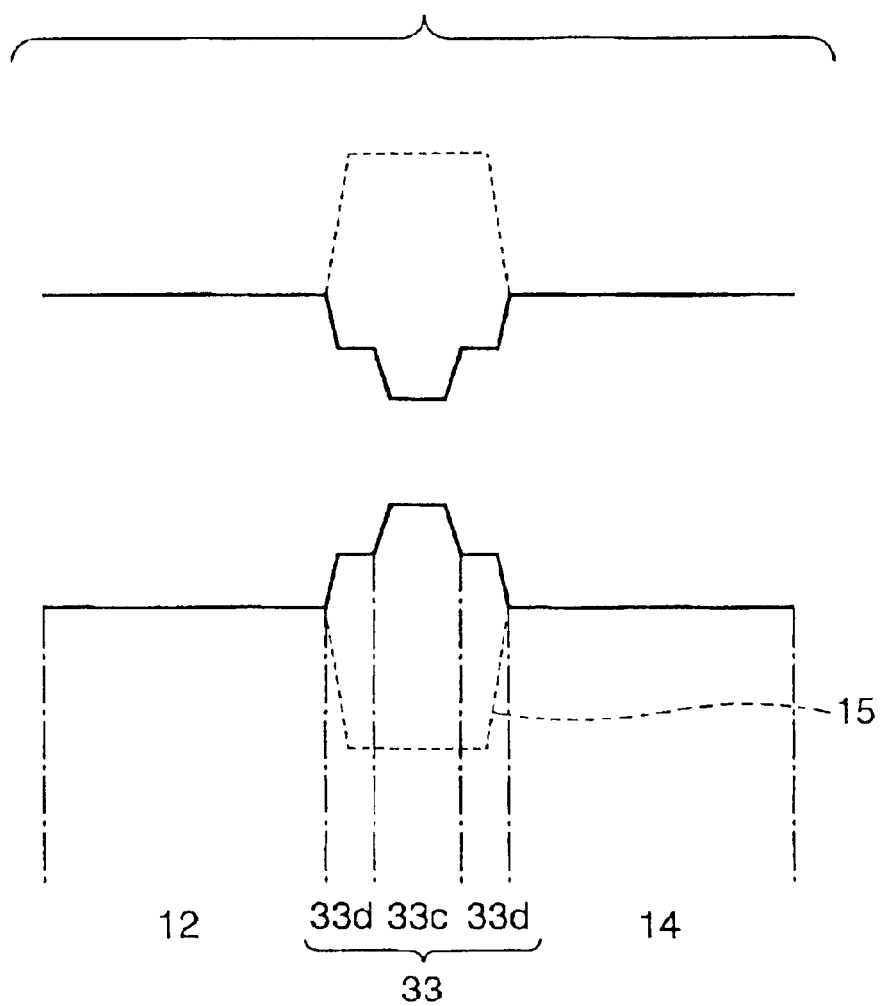
FIG. 6 is a band gap structure diagram of the light emitting diode shown in FIG. 5.

FIG. 6 shows the band gap structure of the light emitting diode. In FIG. 6, the solid lines show the band gaps of the first conductive type clad layer 12, the light emitting layer 33 and the second conductive type clad layer 14, respectively, and the broken line shows the band gap of the insulating layer 15. As shown in herein, the band gap of the light emitting layer 33 becomes smaller in the inner layer 33c than the surface layer 33d. As similar to the first embodiment, the band gap of the light emitting layer 33 is smaller than the band gaps of the first conductive type clad layer 12, the second conductive type clad layer 14 and the insulating layer 15.

In this light emitting diode, when a prescribed voltage is applied between the first electrode 16 and the second electrode 17, an electric current is injected to the microcrystals 33a of the light emitting layer 33, and emission of light occurs in the respective microcrystals 33a. Because the microcrystals 33a comprise the inner layer 33c and the surface layer 33d herein, the band gap changes stepwise. Thus, the light emission efficiency becomes high.

According to this embodiment, in addition to the effect described for the first embodiment, an effect is also obtained in that the light emission efficiency is further increased since the microcrystals 33a in the light emitting layer 33 have the layer structure. This embodiment can be applied in the similar manner to the second embodiment.

(Fourth Embodiment)

Figure 7:
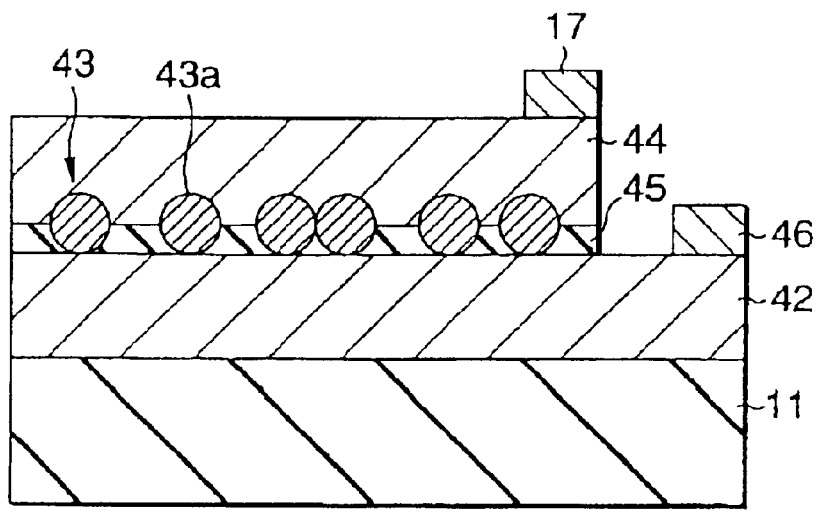
FIG. 7 is a cross sectional view showing the constitution of the light emitting diode of the fourth embodiment of the invention.

FIG. 7 is a cross sectional view showing the constitution of a light emitting diode of the fourth embodiment of the invention. The light emitting diode is an example, in which the materials constituting a first conductive type clad layer 42, a light emitting layer 43, a second conductive type clad layer 44, an insulating layer 45 and the first electrode 46 are different from the first embodiment. Therefore, the same symbols are attached to the same constitutional components, and the symbols, in which the tens digit is changed to "4", are attached to the corresponding constitutional components, so that the detailed descriptions for the same parts are omitted.

The first conductive type clad layer 42 is constituted with, for example, a non-single crystal body, such as n-type BN to which an n-type impurity such as carbon (C) is added. The light emitting layer 43 contains, for example, plural microcrystals 43a comprising GaN. The second conductive type clad layer 44 is constituted with, for example, a non-single crystal body, such as p-type BN to which a p-type impurity such as magnesium is added. The insulating layer 45 is constituted with, for example, a compound of boron (B) and oxygen. Accordingly, in this embodiment, the first conductive type clad layer 42, the light emitting layer 43 and the second conductive type clad layer 44 are constituted with inorganic semiconductors containing nitrogen, respectively. The first conductive type clad layer 42 and the second conductive type clad layer 44 are constituted with the same semiconductor materials, the conductive types of which are different from each other.

In the case where the first conductive type clad layer 42, the light emitting layer 43, the second conductive type clad layer 44 and the insulating layer 45 are constituted with these materials, the band gap of the light emitting layer 43 is smaller than the band gaps of the first conductive type clad layer 42, the second conductive type clad layer 44 and the insulating layer 45, as similar to the first embodiment.

A first electrode 46 has, for example, as similar to the second electrode 17, a structure obtained by laminating a nickel layer, a platinum layer and a gold layer in this order from the side of the first conductive type clad layer 42, followed by subjecting to a heat treatment to make an alloy.

The light emitting diode having such a constitution can be produced by the following manner.

A substrate 11 is prepared, and a first conductive type clad layer 42 comprising a non-single crystal body of n-type BN is formed on one surface thereof by, for example, a sputtering method or a laser accumulation method. At this time, the temperature of the substrate is made 600° C. or less as similar to the first embodiment. Subsequently, in the case where the activation of the impurity in the first conductive type clad layer 42 is insufficient, the activation thereof is conducted by, for example, a laser annealing method as similar to the first embodiment.

Thereafter, plural microcrystals 43a comprising GaN are attached to the first conductive type clad layer 42 on the side opposite to the substrate 11 by, for example, a sputtering method, an MBE method or a laser accumulation method, to form a light emitting layer 43. At this time, the particle diameter of the microcrystals 43a, the coating ratio of the microcrystals 43a on the first conductive type clad layer 42, and the number of lamination of the microcrystals 43a (i.e., the thickness of the light emitting layer 43) are controlled by adjusting the temperature of the substrate 11, the atmospheric gas pressure, the vapor deposition rate and the like.

After forming the light emitting layer 43, a heating treatment in an atmosphere containing nitrogen, such as a nitrogen plasma treatment is conducted. Accordingly, the nitrogen holes present in the microcrystals 43a in the light emitting layer 43 are complemented to increase the crystallinity thereof. Thereafter, a heat treatment in an atmosphere containing oxygen, such as an oxygen plasma treatment, is conducted. Accordingly, the surface of the first conductive type clad layer 42 that is not in contact with the microcrystals 43a is oxidized to form an insulating film 45 comprising a compound of boron and oxygen. At this time, the surface of the microcrystals 43a is also slightly oxidized. The heat treatment in an atmosphere containing oxygen is preferably conducted after the heat treatment in an atmosphere containing nitrogen. This is because when the microcrystals 43a contain many defects, they are liable to be oxidized.

After conducting the heat treatment in an atmosphere containing oxygen, it is preferred to conduct a heat treatment in an atmosphere containing hydrogen such as a hydrogen plasma treatment. Accordingly, an oxide film formed on the surface of the microcrystals 43a can be removed, and nitrogen holes remaining in the microcrystals 43a are complemented to further increase the crystallinity. After conducting the heat treatment in an atmosphere containing hydrogen, a second conductive type clad layer 44 comprising a non-single crystal body of p-type BN is formed on the first conductive type clad layer 42 on the side opposite to the substrate 11 through the light emitting layer 43 and the insulating layer 45 by, for example, a sputtering method or a laser accumulation method. Thereafter, in the case where the activation of the impurity in the second conductive type clad layer 44 is insufficient, the activation thereof is conducted by, for example, a laser annealing method, as similar to the first embodiment.

After forming the second conductive type clad layer 44, the second conductive type clad layer 44, the light emitting layer 43 and the insulating layer 45 are selectively removed in this order corresponding to the position, at which the first electrode 46 is formed, by using a lithography technique as similar to the first embodiment, so as to expose a part of the first conductive type clad layer 42. After exposing the first conductive type clad layer 42, a nickel layer, a platinum layer and a gold layer are vapor deposited in this order in the similar manner as in the first embodiment, so as to selectively form the first electrode 46 and a second electrode 17. Thereafter, the second electrode 17 and the first electrode 46 are made into an alloy by conducting a heat treatment. Accordingly, the light emitting diode shown of this embodiment is formed.

Such a light emitting diode functions as similar to the first embodiment and can be used similarly. According to this embodiment, the similar effect as in the first embodiment can be obtained. This embodiment can be applied in the similar manner to the second and third embodiments.

(Fifth Embodiment)

Figure 8:
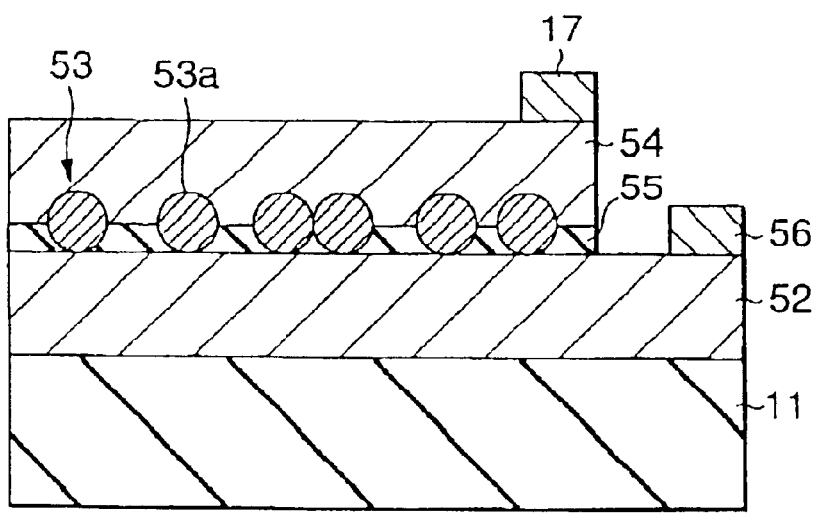
FIG. 8 is a cross sectional view showing the constitution of the light emitting diode of the fifth embodiment of the invention.

FIG. 8 is a cross sectional view showing the constitution of a light emitting diode of the fifth embodiment of the invention. The light emitting diode is an example, in which the materials constituting a first conductive type clad layer 52, a light emitting layer 53, a second conductive type clad layer 54, an insulating layer 55 and a first electrode 56 are different from the first embodiment. Therefore, the same symbols are attached to the same constitutional components, and the symbols, in which the tens digit is changed to "5", are attached to the corresponding constitutional components, so that the detailed descriptions for the same parts are omitted.

The first conductive type clad layer 52 is constituted with, for example, a non-single crystal body of n-type Al-doped $Ga_2O_3$, to which an n-type impurity such as $\beta$-$Ga_2O_3$, aluminum and the like is added. The light emitting layer 53 contains, for example plural microcrystals 53a comprising InN. The second conductive type clad layer 54 is constituted with, for example, a non-single crystal body of p-type ZnO to which a p-type impurity such as nitrogen is added. The insulating layer 55 is constituted with, for example, a compound of gallium and nitrogen or a compound of aluminum, gallium and nitrogen. That is, in this embodiment, the first conductive type clad layer 52 and the second conductive type clad layer 54 are constituted with an inorganic semiconductor containing oxygen, and the light emitting layer 53 is constituted with an inorganic semiconductor containing nitrogen.

In the case where the first conductive type clad layer 52, the light emitting layer 53, the second conductive type clad layer 54 and the insulating layer 55 are constituted with these materials, as similar to the first embodiment, the band gap of the light emitting layer 53 is smaller than the band gaps of the first conductive type clad layer 52, the second conductive type clad layer 54 and the insulating layer 55.

A first electrode 56 has, for example, a structure obtained by laminating a layer of an alloy of nickel and chromium (Cr) and a gold layer in this order from the side of the first conductive type clad layer 52, followed by subjecting to a heat treatment to make an alloy.

The light emitting diode having such a constitution can be produced by the following manner.

A substrate 11 is prepared, and a first conductive type clad layer 52 comprising a non-single crystal body of $\beta$-$Ga_2O_3$ or n-type Al-doped $Ga_2O_3$ is formed on one surface thereof by, for example, a sputtering method, a CVD method, an MBE method or a laser accumulation method. At this time, the temperature of the substrate is made 600° C. or less, as similar to the first embodiment. Subsequently, in the case where the activation of the impurity in the first conductive type clad layer 52 is insufficient, the activation thereof is conducted by, for example, a laser annealing method as similar to the first embodiment.

Thereafter, plural microcrystals 53a comprising InN are attached to the first conductive type clad layer 52 on the side opposite to the substrate 11 by, for example, a sputtering method, an MBE method or a laser accumulation method, to form a light emitting layer 53. At this time, the particle diameter of the microcrystals 53a, the coating ratio of the microcrystals 53a on the first conductive type clad layer 52, and the number of lamination of the microcrystals 53a (i.e., the thickness of the light emitting layer 53) are controlled by adjusting the temperature of the substrate 11, the atmospheric gas pressure, the vapor deposition rate and the like.

After forming the light emitting layer 53, a heating treatment in an atmosphere containing nitrogen, such as a nitrogen plasma treatment, is conducted. Accordingly, the nitrogen holes present in the microcrystals 53a in the light emitting layer 53 are complemented to increase the crystallinity thereof, and the surface of the first conductive type clad layer 52 with which the microcrystals 53a are not in contact is nitrided to form an insulating film 55 comprising a compound of aluminum, gallium and nitrogen. Thereafter, it is preferred to conduct a heat treatment in an atmosphere containing hydrogen, such as a hydrogen plasma treatment. Accordingly, the nitrogen holes remaining in the microcrystals 53a are complemented to further increase the crystallinity.

After conducting the heat treatments in an atmosphere containing oxygen and an atmosphere containing hydrogen, a second conductive type clad layer 54 comprising a non-single crystal body of p-type ZnO is formed on the first conductive type clad layer 52 on the side opposite to the substrate 11 through the light emitting layer 53 and the insulating layer 55 by, for example, a sputtering method, a CVD method, an MBE method or a laser accumulation method. Thereafter, in the case where the activation of the impurity in the second conductive type clad layer 54 is insufficient, the activation thereof is conducted by, for example, a laser annealing method, as similar to the first embodiment.

After forming the second conductive type clad layer 54, the second conductive type clad layer 54, the light emitting layer 53 and the insulating layer 55 are selectively removed in this order corresponding to the position, at which the first electrode 56 is formed, by using a lithography technique as similar to the first embodiment, so as to expose a part of the first conductive type clad layer 52. After exposing a part of the first conductive type clad layer 52, an alloy layer of nickel and chromium and a gold layer are vapor deposited in this order in the similar manner as in the first embodiment, so as to selectively form the first electrode 56, and a nickel layer, a platinum layer and a gold layer are vapor deposited in this order, so as to selectively form a second electrode 17. Thereafter, the second electrode 17 and the first electrode 56 are made into an alloy by conducting a heat treatment. Accordingly, the light emitting diode shown of this embodiment is formed.

Such a light emitting diode functions as similar to the first embodiment and can be used similarly. According to this embodiment, the similar effect as in the first embodiment can be obtained. This embodiment can be applied in the similar manner to the second and third embodiments.

(Sixth Embodiment)

Figure 9:
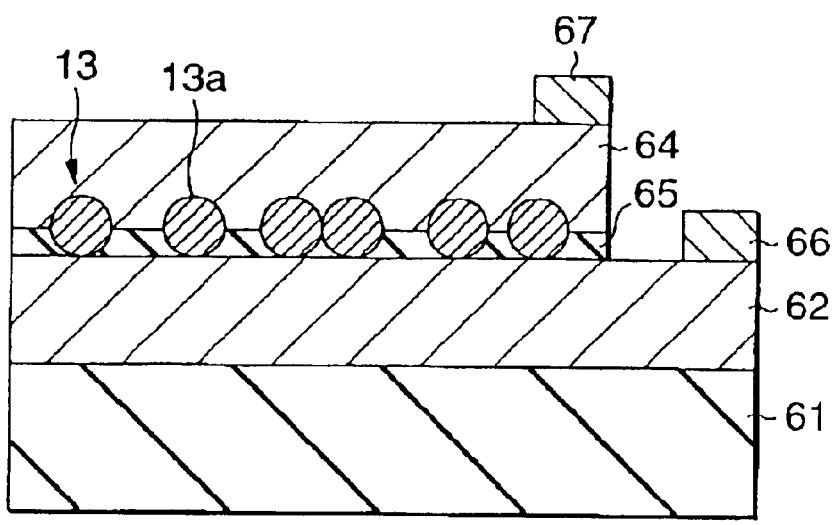
FIG. 9 is a cross sectional view showing the constitution of the light emitting diode of the sixth embodiment of the invention.

FIG. 9 is a cross sectional view showing the constitution of a light emitting diode of the sixth embodiment of the invention. The light emitting diode is an example, in which the materials constituting a substrate 61, a first conductive type clad layer 62, a second conductive type clad layer 64, an insulating layer 65, a first electrode 66 and a second electrode 67 are different from the first embodiment. Therefore, the same symbols are attached to the same constitutional components, and the symbols, in which the tens digit is changed to "6", are attached to the corresponding constitutional components, so that the detailed descriptions for the same parts are omitted.

While the substrate 61 may be constituted with, for example, glass, quartz, sapphire or the like as similar to the first embodiment, it may be constituted with plastics. This is because that, in this embodiment, since the first conductive type clad layer 62 and the second conductive type clad layer 64 are constituted with an organic semiconductor, the production can be conducted at a lower temperature, as will be described later. By constituting the substrate 61 with plastics herein, it is preferred since the area of the substrate 61 can be easily broadened, and the price can be lowered.

The first conductive type clad layer 62 is constituted with, for example, a p-type π-conjugated polymer complex obtained by adding a p-type additive to a π-conjugated polymer complex such as polypyrrole, poly(p-phenylene) or the like. Examples of the p-type additive include, for example, a halogen such as iodine ($I_2$), bromine ($Br_2$), iodine bromide (IBr) and the like, and a metallic compound such as iron chloride ($FeCl_3$), aluminum chloride ($AlCl_3$), arsenic fluoride ($AsF_5$), tin chloride ($SnCl_3$) and the like. The second conductive type clad layer 64 is constituted with, for example, an n-type π-conjugated polymer complex obtained by adding an n-type additive to a π-conjugated polymer complex such as poly(p-phenylene), poly(2,5-pyridine-diyl), poly(quinoline) and the like. Examples of the n-type additive include, for example, a metal such as lithium (Li), potassium (K), sodium (Na) and the like.

Accordingly, in this embodiment, the first conductive type clad layer 62 and the second conductive type clad layer 64 are constituted with an organic semiconductor, in which the first conductive type is p-type, and the second conductive type is n-type.

The insulating layer 65 is constituted with, for example, an organic compound such as polyimide. In the case where the first conductive type clad layer 62, the second conductive clad layer 64 and the insulating layer 65 are constituted with these materials, as similar to the first embodiment, the band gap of the light emitting layer 13 is smaller than the band gaps of the first conductive type clad layer 62, the second conductive type clad layer 64 and the insulating layer 65.

The first electrode 66 is constituted with, for example, ITO (indium tin oxide; a compound of indium (In), tin (Sn) and oxygen) or a tin oxide ($SnO_2$). The second electrode 67 is constituted with, for example, a metal such as indium, aluminum, magnesium, gold, platinum and the like, or an alloy such as an alloy of magnesium and indium (MgIn), an alloy of aluminum and lithium (AlLi), an alloy of magnesium and silver (MgAg) and the like. In this embodiment, the first electrode 66 functions as a p-side electrode, and the second electrode 67 functions as an n-side electrode.

The light emitting diode having such a constitution can be produced by the following manner.

A substrate 61 is prepared, and a first conductive type clad layer 62 comprising a p-type π-conjugated polymer complex is formed on one surface thereof by, for example, a coating method, a vapor deposition method or a laser accumulation method. Thereafter, plural microcrystals 13a comprising ZnO are adhered on the first conductive type clad layer 62 on the side opposite to the substrate 61 in, for example, the similar manner as in the first embodiment, so as to form a light emitting layer 13. An insulating layer 65 comprising polyimide is formed on the first conductive type clad layer 62 on the side of the light emitting layer 13 by, for example, a coating method, a vapor deposition method or a laser accumulation method. Thereafter, the insulating layer 65 is etched to expose a part of the light emitting layer 13 to the surface.

After exposing a part of the light emitting layer 13 on the surface, a second conductive type clad layer 64 comprising an n-type π-conjugated polymer complex is formed on the first conductive type clad layer 62 on the side opposite to the substrate 61 through the light emitting layer 13 and the insulating layer 65 by, for example, a coating method, a vapor deposition method or a laser accumulation method. After forming the second conductive type clad layer 64, the second conductive type clad layer 64, the light emitting layer 13 and the insulating layer 65 are selectively removed in this order corresponding to the position, at which the first electrode 66 is formed, by using a lithography technique as similar to the first embodiment, so as to expose a part of the first conductive type clad layer 62, and a first electrode 66 and a second electrode 67 are selectively formed by, for example, vapor deposition. Accordingly, a light emitting diode according to this embodiment is formed.

Such a light emitting diode functions as similar to the first embodiment and can be used similarly. According to this embodiment, the similar effect as in the first embodiment can be obtained, and because the first conductive type clad layer 62 and the second conductive clad layer 64 are constituted with an organic semiconductor, it can be formed at a lower temperature. Therefore, the range of selection of the material constituting the substrate 61 is further broadened, and the substrate 61 may be constituted with plastics or the like. Therefore, a device array of a large area can be formed at a low cost. This embodiment can be applied in the similar manner to the second and third embodiments.

(Seventh Embodiment)

Figure 10:
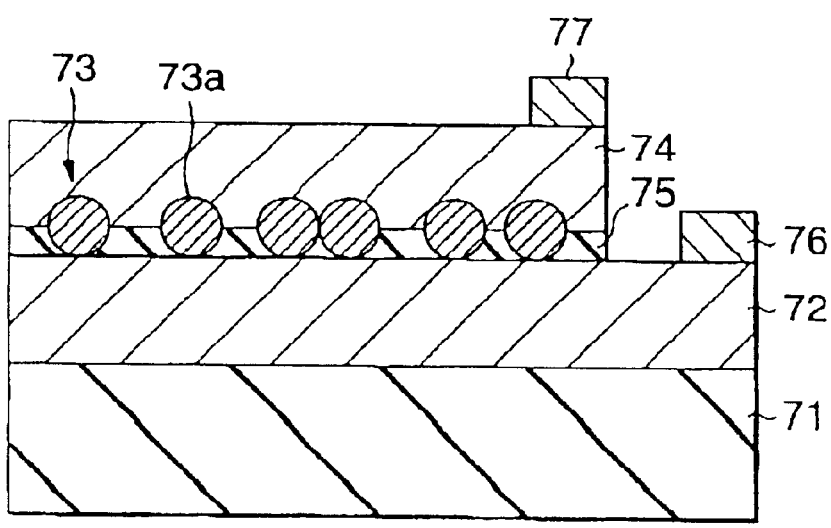
FIG. 10 is a cross sectional view showing the constitution of the light emitting diode of the seventh embodiment of the invention.

FIG. 10 is a cross sectional view showing the constitution of a light emitting diode of the seventh embodiment of the invention. The light emitting diode is an example, in which the materials constituting a substrate 71, a first conductive type clad layer 72, a light emitting layer 73, a second conductive type clad layer 74, an insulating layer 75, a first electrode 76 and a second electrode 77 are different from the first embodiment. Therefore, the symbols, in which the tens digit is changed to "7", are attached to the corresponding constitutional components, so that the detailed descriptions for the same parts are omitted.

The substrate 71 is constituted with, for example, as similar to the sixth embodiment, glass, quartz, sapphire or plastics. The first conductive type clad layer 72 is constituted with, for example, a p-type conductive resin obtained by adding copper sulfide (CuS) in the form of super-fine particles as a conductor to a polymer compound such as polyvinyl alcohol. The light emitting layer 73 contains, for example, plural microcrystals 73a comprising InN. The second conductive type clad layer 74 is constituted with, for example, an n-type conductive resin obtained by adding copper sulfide or mercury sulfide (HgS) in the form of super-fine particles as a conductor to a polymer compound such as polyvinyl alcohol. That is, in this light emitting diode, the first conductive type clad layer 72 and the second conductive clad layer 74 are constituted with a conductive resin, in which the first conductive type clad layer 72 is a p-type clad layer, and the second conductive type clad layer 74 is an n-type clad layer.

The insulating layer 75 is constituted with, for example, an organic compound such as polyimide as similar to the sixth embodiment. In the case where the first conductive type clad layer 72, the light emitting layer 73, the second conductive type clad layer 74 and the insulating layer 75 are constituted with these materials, as similar to the first embodiment, the band gap of the light emitting layer 73 is smaller than the band gaps of the first conductive type clad layer 72, the second conductive type clad layer 74 and the insulating layer 75.

The first electrode 76 is constituted with, for example ITO or tin oxide ($SnO_2$) as similar to the sixth embodiment. The second electrode 77 is constituted with, for example, a metal such as indium, aluminum, magnesium, gold, platinum and the like, or an alloy such as an alloy of magnesium and indium, an alloy of aluminum and lithium, an alloy of magnesium and silver and the like, as similar to the sixth embodiment. With respect to these, as similar to the sixth embodiment, the first electrode 76 functions as a p-side electrode, and the second electrode 77 functions as an n-side electrode.

The light emitting diode having such a constitution can be produced by, for example, the manner similar to the sixth embodiment.

An organosol containing, for example, a metallic sulfide in the form of super-fine particles is coated on one surface of a substrate 71, and then dried to form a first conductive type clad layer 72 comprising a p-type conductive resin. Subsequently, plural microcrystals 73a comprising InN are attached to form a light emitting layer 73, and then an insulating layer 75 comprising polyimide is formed. After exposing a part of the surface of the light emitting layer 73 by etching the insulating layer 75, an organosol containing a metallic sulfide in the form of super-fine particles, for example, are then coated and dried to form a second conductive type clad layer 74 comprising an n-type conductive resin. Thereafter, a part of the first conductive type clad layer 72 is exposed by a lithography technique, and each of a first electrode 76 and a second electrode 77 are selectively formed. Accordingly, a light emitting diode according to this embodiment is formed.

Such a light emitting diode functions as similar to the first embodiment and can be used similarly. According to this embodiment, the similar effect as in the first embodiment can be obtained, and because the first conductive type clad layer 72 and the second conductive clad layer 74 are constituted with a conductive resin, it can be formed at a lower temperature. Therefore, the substrate 71 can be constituted with plastics or the like, and a device array of a large area can be formed at a low cost. This embodiment can be applied in the similar manner to the second and third embodiments.

(Eighth Embodiment)

Figure 11:
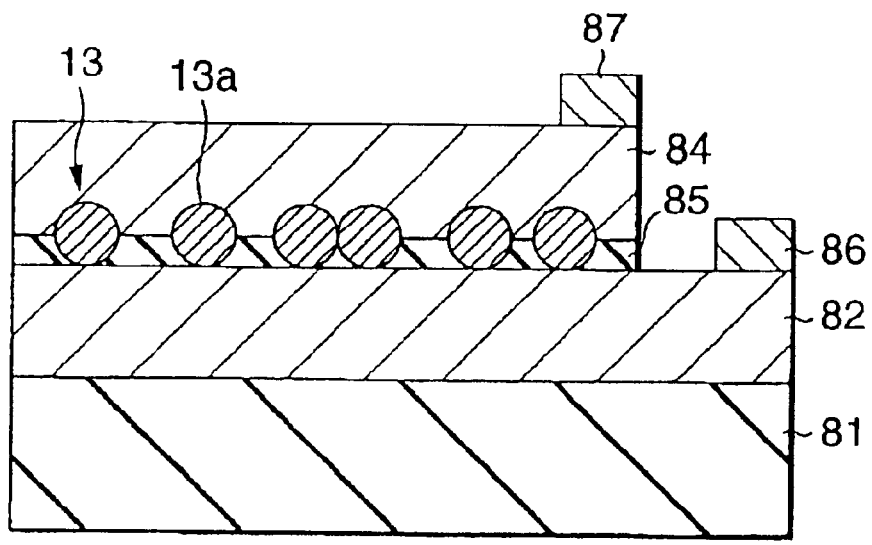
FIG. 11 is a cross sectional view showing the constitution of the light emitting diode of the eighth embodiment of the invention.

FIG. 11 is a cross sectional view showing the constitution of a light emitting diode of the eighth embodiment of the invention. The light emitting diode is an example, in which the materials constituting a substrate 81, a first conductive type clad layer 82, a second conductive type clad layer 84, an insulating layer 85, a first electrode 86 and a second electrode 87 are different from the first embodiment. Therefore, the same symbols are attached to the same constitutional components, and the symbols, in which the tens digit is changed to "8", are attached to the corresponding constitutional components, so that the detailed descriptions for the same parts are omitted.

The substrate 81 is constituted with, for example, glass, quartz, sapphire, plastics or the like, as similar to the sixth embodiment. The first conductive type clad layer 82 is constituted with, for example, a p-type polymer silicone derivative formed by adding a p-type additive to a polymer silicon derivative such as an organo-polysilane, a silanylene series polymer or the like. Examples of the p-type additive include a halogen such as iodine and the like, and a metallic compound such as iron chloride, aluminum chloride, arsenic fluoride, tin chloride and the like. The second conductive type clad layer 84 is constituted with, for example, an n-type π-conjugated polymer complex or an n-type polymer complex, to which an n-type impurity is added, or an n-type conductive resin obtained by mixing a polymer compound with a conductor. Therefore, in this light emitting diode, the first conductive type clad layer 82 is a p-type clad layer constituted with an organic semiconductor, and the second conductive type clad layer 84 is an n-type clad layer constituted with an organic semiconductor or a conductive resin.

The insulating layer 85 is constituted with, for example an organic compound such as polyimide, as similar to the sixth embodiment. In the case where the first conductive type clad layer 82, the second conductive type clad layer 84 and the insulating layer 85 are constituted with these materials, as similar to the first embodiment, the band gap of the light emitting layer 13 is smaller than the band gaps of the first conductive type clad layer 82, the second conductive type clad layer 84 and the insulating layer 85.

The first electrode 86 is constituted with, for example, ITO or tin oxide ($SnO_2$) as similar to the sixth embodiment. The second electrode 87 is constituted with, for example, a metal such as indium, aluminum, magnesium, gold, platinum and the like, or an alloy such as an alloy of magnesium and indium, an alloy of aluminum and lithium, an alloy of magnesium and silver and the like, as similar to the sixth embodiment. With respect to these, as similar to the sixth embodiment, the first electrode 86 functions as a p-side electrode, and the second electrode 87 functions as an n-side electrode.

The light emitting diode having such a constitution can be produced by, for example, the manner similar to the sixth embodiment.

A first conductive type clad layer 82 comprising a p-type polymer silicone derivative is formed on one surface of a substrate 81 by, for example, a coating method, a vapor deposition method or a laser accumulation method, and plural microcrystals 13a comprising ZnO are attached to form a light emitting layer 13. After forming an insulating layer 85 comprising polyimide, a part of the light emitting layer 13 is exposed to the surface by etching the insulating layer 85, and a second conductive type clad layer 84 comprising an n-type π-conjugated polymer complex or the like is formed by, for example, a coating method, a vapor deposition method or a laser accumulation method. Subsequently, a part of the first conductive type clad layer 82 is exposed by a lithography technique, and each of the first electrode 86 and the second electrode 87 are selectively formed. Accordingly, the light emitting diode according to this embodiment is formed.

Such a light emitting diode functions as similar to the first embodiment and can be used similarly. According to this embodiment, the similar effect as in the first embodiment can be obtained, and because the first conductive type clad layer 82 is constituted with an organic semiconductor, and the second conductive clad layer 84 is constituted with an organic semiconductor or a conductive resin, it can be formed at a lower temperature. Therefore, the substrate 81 can be constituted with plastics or the like, and a device array of a large area can be formed at a low cost. This embodiment can be applied in the similar manner to the second and third embodiments.

(Ninth Embodiment)

Figure 12:
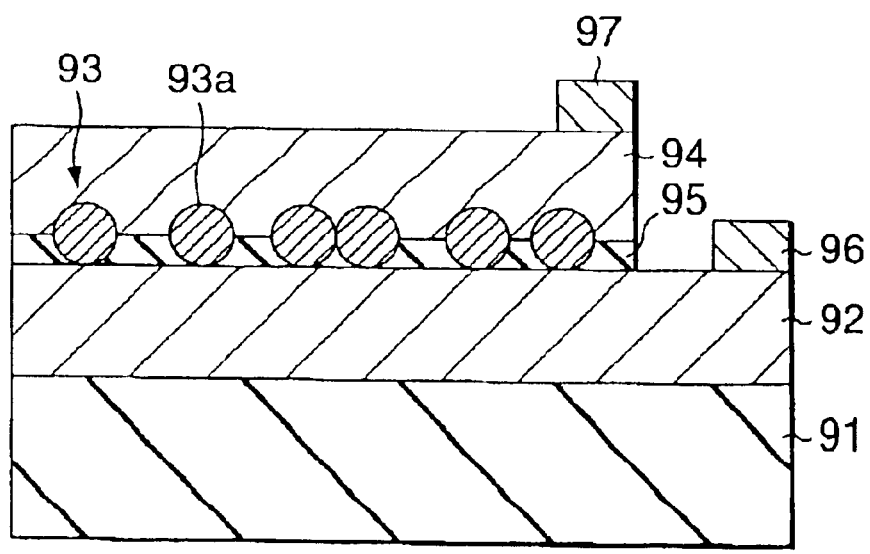
FIG. 12 is a cross sectional view showing the constitution of the semiconductor laser of the ninth embodiment of the invention.

FIG. 12 is a cross sectional view showing the constitution of a light emitting diode of the ninth embodiment of the invention. The light emitting diode is an example, in which the materials constituting a substrate 91, a first conductive type clad layer 92, a light emitting layer 93, a second conductive type clad layer 94, an insulating layer 95, a first electrode 96 and a second electrode 97 are different from the first embodiment. Therefore, the symbols, in which the tens digit is changed to "9", are attached to the corresponding constitutional components, so that the detailed descriptions for the same parts are omitted.

The substrate 91 is constituted with, for example, glass, quartz, sapphire, plastics or the like, as similar to the sixth embodiment. The first conductive type clad layer 92 is constituted with, for example, a p-type polymer metallic complex obtained by adding a p-type additive to a polymer metallic complex. Examples of the polymer metallic complex include phthalocyanine, a metallic phthalocyanine containing a metal, such as iron, nickel, copper (Cu), zinc (Zn), platinum, lead (Pb), chromium (Cr), ruthenium (Ru), rhodium (Rh), silicon, germanium (Ge), tin (Sn) and the like, and a derivative thereof. Examples of the p-type additive include a halogen, such as iodine, bromine, iodine bromide and the like, and a metallic compound, such as iron chloride, aluminum chloride, arsenic fluoride, tin chloride and the like.

The light emitting layer 93 contains, for example, plural microcrystals 93a comprising CdSe. The second conductive type clad layer 94 is constituted with, for example, an n-type polymer metallic complex obtained by adding an n-type impurity to a polymer metallic complex. Examples of the polymer metallic complex include, for example, a metallic phthalocyanine containing a metal such as cobalt (Co) and the like, a perylene pigment and a porphyrin metallic complex, and examples of the n-type additive include a halogen such as iodine and the like. Therefore, in this light emitting diode, as similar to the sixth embodiment, each of the first conductive type clad layer 92 and the second conductive clad layer 94 are constituted with an organic semiconductor, in which the first conductive type clad layer 92 is a p-type clad layer, and the second conductive type clad layer 94 is an n-type clad layer.

The insulating layer 95 is constituted with, for example, an organic compound such as polyimide or the like, as similar to the sixth embodiment. In the case where the first conductive type clad layer 92, the light emitting layer 93, the second conductive type clad layer 94 and the insulating layer 95 are constituted with these materials, as similar to the first embodiment, the band gap of the light emitting layer 93 is smaller than the band gaps of the first conductive type clad layer 92, the second conductive type clad layer 94 and the insulating layer 95.

The first electrode 96 is constituted with, for example, ITO or tin oxide ($SnO_2$) as similar to the sixth embodiment. The second electrode 97 is constituted with, for example, a metal such as indium, aluminum, magnesium, gold, platinum and the like, or an alloy such as an alloy of magnesium and indium, an alloy of aluminum and lithium, an alloy of magnesium and silver and the like, as similar to the sixth embodiment. With respect to these, as similar to the sixth embodiment, the first electrode 96 functions as a p-side electrode, and the second electrode 97 functions as an n-side electrode.

The light emitting diode having such a constitution can be produced by, for example, the manner similar to the sixth embodiment.

A first conductive type clad layer 92 comprising a p-type polymer metallic complex is formed on one surface of a substrate 91 by, for example, a coating method, a vapor deposition method or a laser accumulation method, and plural microcrystals 93a comprising CdSe are attached to form a light emitting layer 93. After forming an insulating layer 95 comprising polyimide, a part of the light emitting layer 93 is exposed to the surface by etching the insulating layer 95, and a second conductive type clad layer 94 comprising an n-type polymer metallic complex or the like is formed by, for example, a coating method, a vapor deposition method or a laser accumulation method. Subsequently, a part of the first conductive type clad layer 92 is exposed by a lithography technique, and each of the first electrode 96 and the second electrode 97 are selectively formed. Accordingly, the light emitting diode according to this embodiment is formed.

Such a light emitting diode functions as similar to the first embodiment and can be used similarly. According to this embodiment, the similar effect as in the first embodiment can be obtained, and because the first conductive type clad layer 92 and the second conductive clad layer 94 are constituted with an organic semiconductor, it can be formed at a lower temperature. Therefore, the substrate 91 can be constituted with plastics or the like, and a device array of a large area can be formed at a low cost. This embodiment can be applied in the similar manner to the second and third embodiments.

(Tenth Embodiment)

Figure 13:
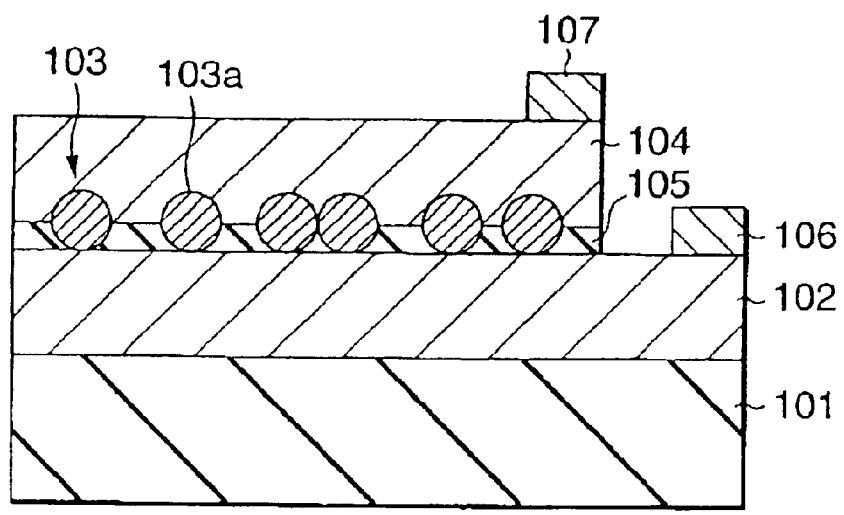
FIG. 13 is a cross sectional view showing the constitution of the light emitting diode of the tenth embodiment of the invention.

FIG. 13 is a cross sectional view showing the constitution of a light emitting diode of the tenth embodiment of the invention. The light emitting diode is an example, in which the materials constituting a substrate 101, a first conductive type clad layer 102, a light emitting layer 103, a second conductive type clad layer 104, an insulating layer 105, a first electrode 106 and a second electrode 107 are different from the first embodiment. Therefore, the symbols, in which the hundreds digit is changed to "1", and the tens digit is changed to "0", are attached to the corresponding constitutional components, so that the detailed descriptions for the same parts are omitted.

The substrate 101 is constituted with, for example, glass, quartz, sapphire, plastics or the like, as similar to the sixth embodiment. The first conductive type clad layer 102 is constituted with, for example, a p-type π-conjugated polymer complex as similar to the sixth embodiment. The light emitting layer 103 contains, for example, plural microcrystals 103a comprising InN. The second conductive type clad layer 104 is constituted with, for example an n-type π-conjugated polymer complex as similar to the sixth embodiment. The insulating layer 105 is constituted with, for example, an organic compound such as polyimide and the like as similar to the sixth embodiment. The first electrode 106 is constituted with, for example ITO or tin oxide ($SnO_2$) as similar to the sixth embodiment. The second electrode 107 is constituted with, for example, a metal such as indium, aluminum, magnesium, gold, platinum and the like, or an alloy such as an alloy of magnesium and indium, an alloy of aluminum and lithium, an alloy of magnesium and silver and the like, as similar to the sixth embodiment. That is, this light emitting diode has the same constitution as the sixth embodiment except that the material constituting the light emitting layer 103 is different.

The light emitting diode having such a constitution can be produced by, for example, the manner similar to the sixth embodiment. Such a light emitting diode functions as similar to the first embodiment and can be used similarly. According to this embodiment, the similar effect as in the first embodiment can be obtained, and because the first conductive type clad layer 102 and the second conductive clad layer 104 are constituted with an organic semiconductor, the substrate 101 can be constituted with plastics or the like, so that a device array of a large area can be formed at a low cost. This embodiment can be applied in the similar manner to the second and third embodiments.

(Eleventh Embodiment)

Figure 14:
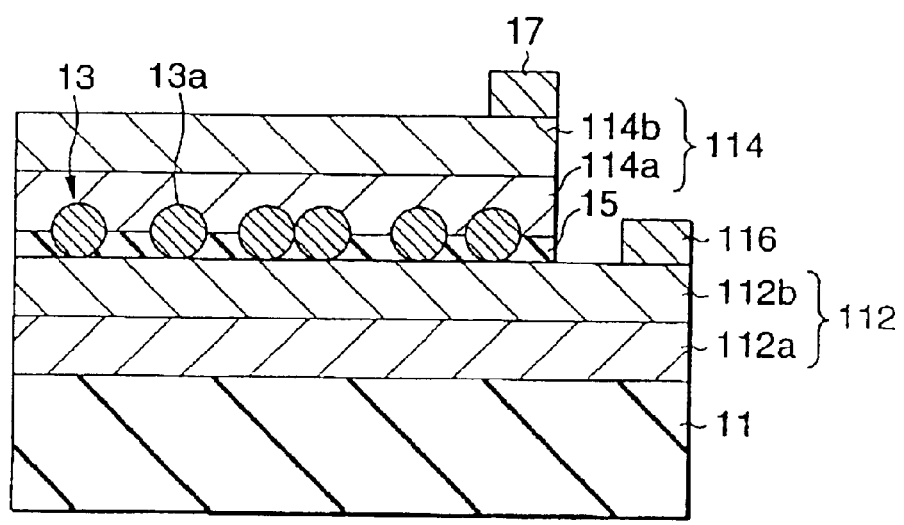
FIG. 14 is a cross sectional view showing the constitution of the light emitting diode of the eleventh embodiment of the invention.

FIG. 14 is a cross sectional view showing the constitution of a light emitting diode of the eleventh embodiment of the invention. This light emitting diode has the same constitution as the first embodiment except that the constitutions of a first conductive type clad layer 112, a second conductive type clad layer 114 and a first electrode 116 are different, and can be produced in the similar manner. It is also used in the similar manner as the first embodiment. Therefore, the same symbols are attached to the same constitutional components, and the symbols, in which the hundreds digit is changed to "1", and the tens digit is changed to "1", are attached to the corresponding constitutional components, so that the detailed descriptions for the same parts are omitted.

The first conductive type clad layer 112 has, for example, a multi-layer structure comprising a first layer 112a and a second layer 112b laminated in this order from the side of a substrate 11. The first layer 112a, for example, has a thickness of 0.4 μm and is constituted with a non-single crystal body of n-type BN, to which an n-type impurity such as carbon is added. The second layer 112b, for example, has a thickness of 0.1 μm and is constituted with a non-single crystal body of n-type AlGaN, to which an n-type impurity such as silicon is added.

The second conductive clad layer 114 has, for example, a multi-layer structure comprising a first layer 114a and a second layer 114b laminated in this order from the side of a light emitting layer 13. The first layer 114a, for example, has a thickness of 0.1 μm and is constituted with a non-single crystal body of p-type AlGaN, to which a p-type impurity such as magnesium is added. The second layer 114b, for example, has a thickness of 0.4 μm and is constituted with a non-single crystal body of p-type BN, to which a p-type impurity such as magnesium is added.

The first electrode 116 functions as an n-side electrode and has, for example, a structure obtained by laminating a titanium layer, a nickel layer, a platinum layer and a gold layer in this order from the side of the first conductive type clad layer 112, followed by subjecting to a heat treatment to make an alloy.

Figure 15:
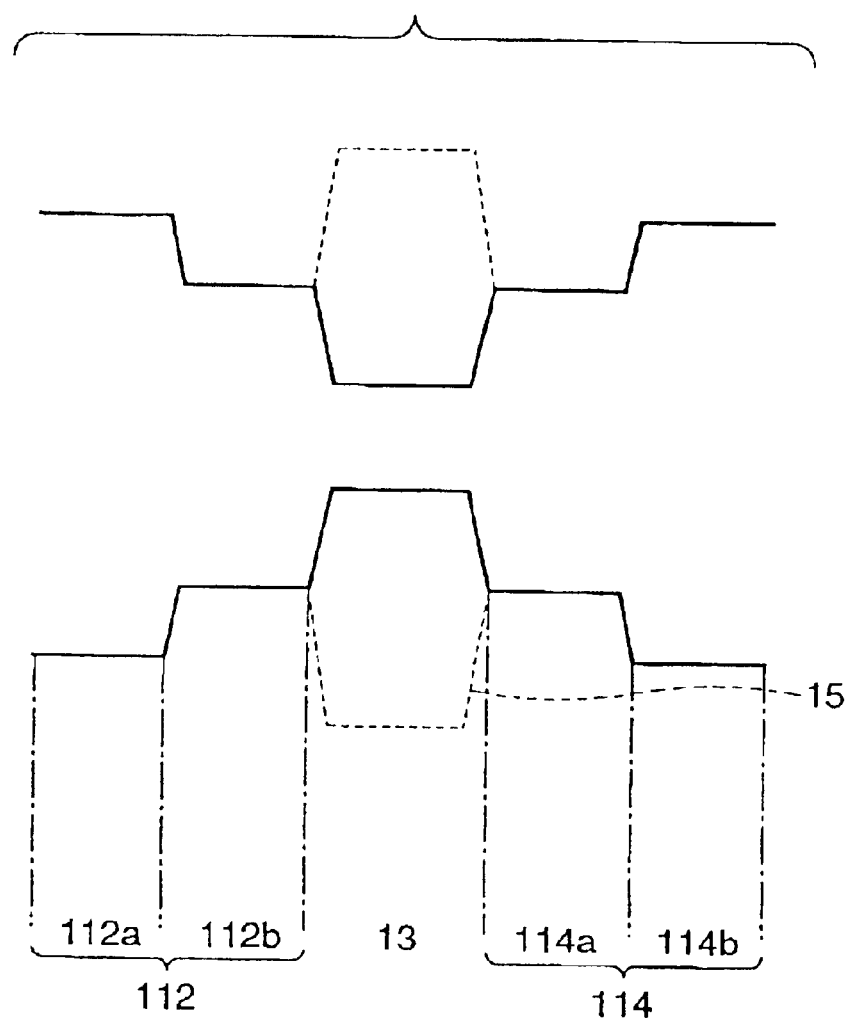
FIG. 15 is a band gap structure diagram of the light emitting diode shown in FIG. 14.

FIG. 15 shows a band gap structure of this light emitting diode. In FIG. 15, the solid lines show the band gaps of the first conductive type clad layer 112, the light emitting layer 13 and the second conductive type clad layer 114, respectively, and the broken line shows the band gap of the insulating layer 15. The band gap of the first conductive type clad layer 112 is about 6.2 eV for the first layer 112a and about from 3.4 to 4.8 eV for the second layer 112b, and thus that of the side of the light emitting layer 13 is smaller. The band gap of the second conductive type clad layer 114 is also about from 3.4 to 4.8 eV for the first layer 114a and about 6.2 eV for the second layer 114b, and thus that of the side of the light emitting layer 13 is smaller. This is to increase the injection efficiency of an electric charge to increase the light emission efficiency. The band gap of the light emitting layer 13 is about 3.3 eV, which is smaller than the band gaps of the first conductive type clad layer 112, the second conductive type clad layer 114 and the insulating layer 15, as similar to the first embodiment.

In this light emitting diode, when a prescribed voltage is applied between the first electrode 116 and a second electrode 17, an electric current is injected to microcrystals 13a of the light emitting layer 13, and light emission occurs in the microcrystals 13a. Because each of the first conductive type clad layer 112 and the second conductive type clad layer 114 have a multi-layer structure, in which the band gap is decreased stepwise toward the side of the light emitting layer 13, the injection efficiency of an electric charge is increased to increase the light emission efficiency.

According to this embodiment, because each of the first conductive type clad layer 112 and the second conductive type clad layer 114 have a multi-layer structure, in which the side of the light emitting layer 13 has a smaller band gap, the light emission efficiency can be further increased, in addition to the effect described for the first embodiment. This embodiment can be applied in the similar manner to the second to fifth embodiments.

(Twelfth Embodiment)

Figure 16:
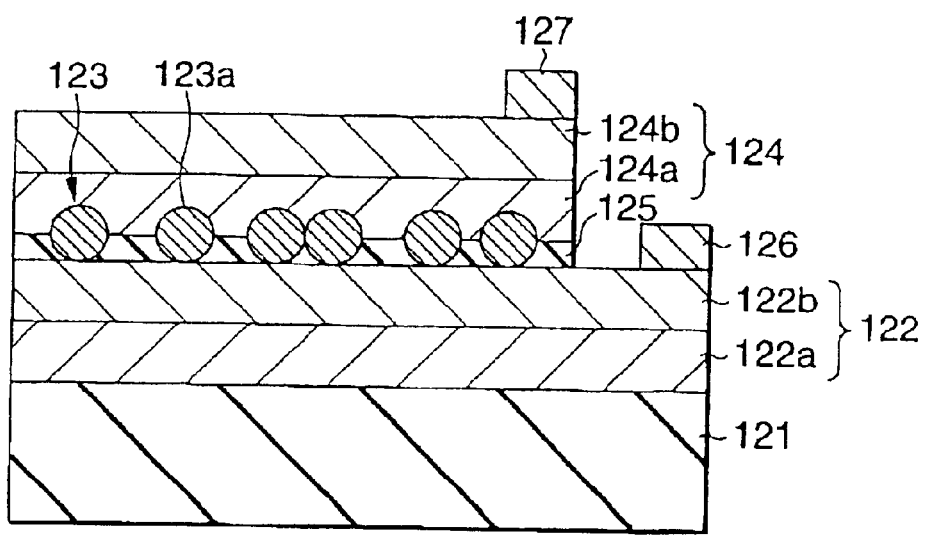
FIG. 16 is a cross sectional view showing the constitution of the light emitting diode of the twelfth embodiment of the invention.

FIG. 16 is a cross sectional view showing the constitution of a light emitting diode of the twelfth embodiment of the invention. This light emitting diode is an example, in which each of a first conductive type clad layer 122 and a second conductive type clad layer 124 have a multi-layer structure, and the materials constituting a substrate 121, the first conductive type clad layer 122, a light emitting layer 123, the second conductive type clad layer 124, an insulating layer 125, a first electrode 126 and a second electrode 127 are different from the first embodiment. Therefore, the symbols, in which the hundreds digit is changed to "1", and the tens digit is changed to "2", are attached to the corresponding constitutional components, and the detailed descriptions for the same parts are omitted.

The first conductive type clad layer 122 has, for example, a multi-layer structure comprising a first layer 122a and a second layer 122b laminated in this order from the side of the substrate 121. The first layer 122a, for example, has a thickness of 0.4 μm and is constituted with a p-type polydimethyl silane, to which a p-type additive is added. The second layer 122b, for example, has a thickness of 0.1 μm and is constituted with a p-type poly(p-phenylene), to which a p-type additive is added. The band gap of the first layer 122a is about 3.5 eV, and the band gap of the second layer 122b is about 3.2 eV.

The second conductive type clad layer 124 has, for example, a multi-layer structure comprising a first layer 124a and a second layer 124b laminated in this order from the side of the light emitting layer 123. The first layer 124a, for example, has a thickness of 0.4 μm and is constituted with an n-type poly(p-phenylene), to which an n-type additive is added. The second layer 124b, for example, has a thickness of 0.1 μm and is constituted with an n-type polydimethyl silane, to which an n-type additive is added. The band gap of the first layer 124a is about 3.2 eV, and the band gap of the second layer 124b is about 3.5 eV. That is, in this embodiment, each of the first conductive type clad layer 122 and the second conductive type clad layer 124 have a multi-layer structure comprising an organic semiconductor, and the band gaps thereof are constituted in such a manner that the side of the light emitting layer 123 becomes smaller.

The substrate 121 is constituted with, for example, glass, quartz, sapphire or plastics as similar to the sixth embodiment, in which the first conductive type clad layer 62 and the second conductive type clad layer 64 are constituted with an organic semiconductor. The light emitting layer 123 contains, for example, plural microcrystals 123a comprising InN. The insulating layer 125 is constituted with, for example, an organic compound such as polyimide as similar to the sixth embodiment. The band gap of the light emitting layer 123 is about 1.9 eV, and as similar to the first embodiment, is smaller than the band gaps of the first conductive type clad layer 122, the second conductive type clad layer 124 and the insulating layer 125.

The first electrode 126 is constituted with, for example, ITO or tin oxide ($SnO_2$) as similar to the sixth embodiment. The second electrode 127 is constituted with, for example, a metal such as indium, aluminum, magnesium, gold, platinum and the like, or an alloy such as an alloy of magnesium and indium, an alloy of aluminum and lithium, an alloy of magnesium and silver and the like, as similar to the sixth embodiment. With respect to these, as similar to the sixth embodiment, the first electrode 126 functions as a p-side electrode, and the second electrode 127 functions as an n-side electrode.

The light emitting diode having such a constitution can be produced by, for example, the manner similar to the sixth embodiment. This light emitting diode functions as similar to the first embodiment and can be used similarly. However, because each of the first conductive type clad layer 122 and the second conductive type clad layer 124 have a multi-layer structure, in which the band gap is decreased stepwise toward the light emitting layer 123, the injection efficiency of an electric charge is increased, and the light emission efficiency is increased.

According to this embodiment, in addition to the effect described for the first embodiment, because each of the first conductive type clad layer 122 and the second conductive type clad layer 124 are constituted with an organic semiconductor, it can be produced at a lower temperature, and because each of the first conductive type clad layer 122 and the second conductive type clad layer 124 have a multi-layer structure, in which the side of the light emitting layer 123 has a smaller band gap, the light emission efficiency can be further increased. This embodiment can be applied in the similar manner to the second and third embodiments.

(Thirteenth Embodiment)

Figure 17:
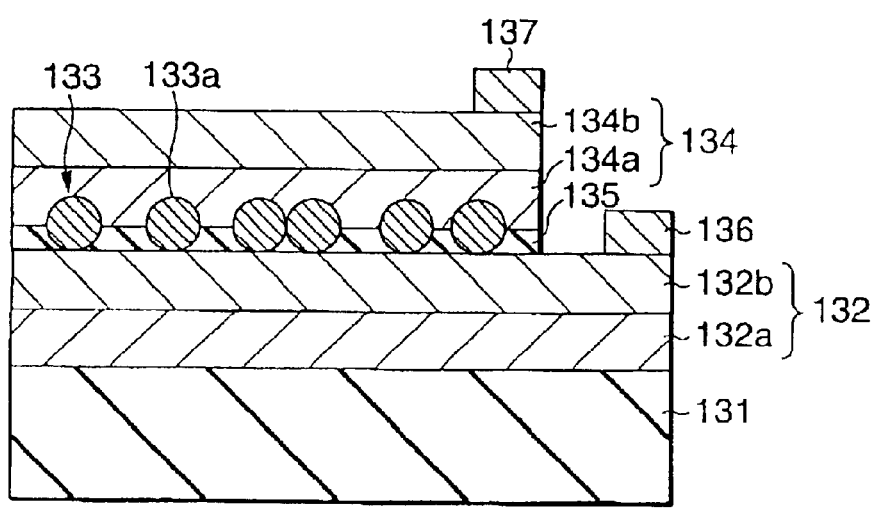
FIG. 17 is a cross sectional view showing the constitution of the light emitting diode of the thirteenth embodiment of the invention.

FIG. 17 is a cross sectional view showing the constitution of a light emitting diode of the thirteenth embodiment of the invention. This light emitting diode is an example, in which each of a first conductive type clad layer 132 and a second conductive type clad layer 134 have a multi-layer structure, and the materials constituting a substrate 131, the first conductive type clad layer 132, a light emitting layer 133, the second conductive type clad layer 134, an insulating layer 135, a first electrode 136 and a second electrode 137 are different from the first embodiment. Therefore, the symbols, in which the hundreds digit is changed to "1", and the tens digit is changed to "3", are attached to the corresponding constitutional components, and the detailed descriptions for the same parts are omitted.

The first conductive type clad layer 132 has, for example, a multi-layer structure comprising a first layer 132a and a second layer 132b laminated in this order from the side of the substrate 131. The first layer 132a, for example, has a thickness of 0.4 μm and is constituted with a p-type polypyrrole, to which a p-type additive is added. The second layer 132b, for example, has a thickness of 0.1 μm and is constituted with a p-type poly(phenylene), to which a p-type additive is added. The band gap of the first layer 132a is about 3.6 eV, and the band gap of the second layer 132b is about 3.2 eV.

The second conductive type clad layer 134 has, for example, a multi-layer structure comprising a first layer 134a and a second layer 134b laminated in this order from the side of the light emitting layer 133. The first layer 134a, for example, has a thickness of 0.1 μm and is constituted with an n-type poly(p-phenylene), to which an n-type additive is added. The second layer 134b, for example, has a thickness of 0.4 μm and is constituted with an n-type polyquinoline, to which an n-type additive is added. The second layer 134b has a high adhesion property to the second electrode 137, and functions as an adhesion layer to increase the adhesion property to the second electrode 137. The band gaps of the first layer 134a and the second layer 134b are about 3.2 eV. That is, in this embodiment, each of the first conductive type clad layer 132 and the second conductive type clad layer 134 have a multi-layer structure comprising an organic semiconductor, in which the band gaps thereof are constituted in such a manner that the side of the light emitting layer 133 becomes smaller in the first conductive type clad layer 132, and in the second conductive type clad layer 134, an adhesive layer is formed on the side of the second electrode 137.

The substrate 131 is constituted with, for example, glass, quartz, sapphire or plastics as similar to the sixth embodiment, in which the first conductive type clad layer 62 and the second conductive type clad layer 64 are constituted with an organic semiconductor. The light emitting layer 133 contains, for example, plural microcrystals 133a comprising InN. The insulating layer 135 is constituted with, for example, an organic compound such as polyimide as similar to the sixth embodiment. The band gap of the light emitting layer 133 is about 1.9 eV, and as similar to the first embodiment, is smaller than the band gaps of the first conductive type clad layer 132, the second conductive type clad layer 134 and the insulating layer 135.

The first electrode 136 is constituted with, for example, ITO or tin oxide ($SnO_2$) as similar to the sixth embodiment. The second electrode 137 is constituted with, for example, a metal such as indium, aluminum, magnesium, gold, platinum and the like, or an alloy such as an alloy of magnesium and indium, an alloy of aluminum and lithium, an alloy of magnesium and silver and the like, as similar to the sixth embodiment. With respect to these, as similar to the sixth embodiment, the first electrode 136 functions as a p-side electrode, and the second electrode 137 functions as an n-side electrode.

The light emitting diode having such a constitution can be produced by, for example, the manner similar to the sixth embodiment. This light emitting diode functions as similar to the first embodiment and can be used similarly. However, because each of the first conductive type clad layer 132 has a multi-layer structure, in which the band gap is decreased stepwise toward the light emitting layer 133, the injection efficiency of an electric charge is increased, and the light emission efficiency is increased.

According to this embodiment, in addition to the effect described for the first embodiment, because each of the first conductive type clad layer 132 and the second conductive type clad layer 134 are constituted with an organic semiconductor, it can be produced at a lower temperature, and because the first conductive type clad layer 132 has a multi-layer structure, in which the side of the light emitting layer 133 has a smaller band gap, the light emission efficiency can be further increased. Furthermore, because the second conductive type clad layer 134 has a multi-layer structure, in which the adhesion layer is present on the side of the second electrode 137, the adhesion property of the second electrode 137 can be improved. This embodiment can be applied to the second to twelfth embodiments.

(Fourteenth Embodiment)

Figure 18:
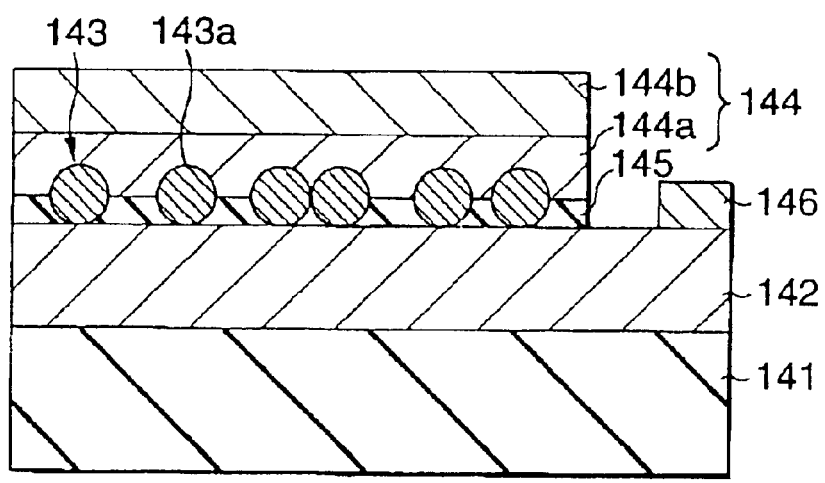
FIG. 18 is a cross sectional view showing the constitution of the light emitting diode of the fourteenth embodiment of the invention.

FIG. 18 is a cross sectional view showing the constitution of a light emitting diode of the fourteenth embodiment of the invention. This light emitting diode is an example, in which a second conductive type clad layer 144 has a multi-layer structure, the second electrode is deleted, and the materials constituting a substrate 141, a first conductive type clad layer 142, a light emitting layer 143, the second conductive type clad layer 144, an insulating layer 145 and a first electrode 146 are different from the first embodiment. Therefore, the symbols, in which the hundreds digit is changed to "1", and the tens digit is changed to "4", are attached to the corresponding constitutional components, and the detailed descriptions for the same parts are omitted.

The substrate 141 is constituted with, for example, glass, quartz, sapphire or plastics as similar to the sixth embodiment, in which the first conductive type clad layer 62 and the second conductive type clad layer 64 are constituted with an organic semiconductor. The first conductive type clad layer 142 is constituted with, for example, a p-type organic semiconductor such as p-type poly(p-phenylene), to which a p-type additive is added. The band gap of the first conductive type clad layer 142 is about 3.2 eV. The light emitting layer 143 contains, for example, plural microcrystals 143a comprising InN.

The second conductive type clad layer 144 has, for example, a multi-layer structure comprising a first layer 144a and a second layer 144b laminated in this order from the side of the light emitting layer 143. The first layer 144a, for example, has a thickness of 0.1 μm and is constituted with an n-type polyquinoline, to which an n-type additive is added. The second layer 144b, for example, has a thickness of 0.4 μm and is constituted with an n-type poly(phenylene), to which an n-type additive is added. The second layer 144b has a high conductivity, and is also an electrode layer functioning as an n-side electrode. The band gaps of the first layer 144a and the second layer 144b are about 3.2 eV.

The insulating layer 145 is constituted with, for example, an organic compound such as polyimide as similar to the sixth embodiment. In the case where the first conductive type clad layer 142, the light emitting layer 143, the second conductive type clad layer 144 and the insulating layer 145 are constituted with these materials, as similar to the first embodiment, the band gap of the light emitting layer 143 is smaller than the band gaps of the first conductive type clad layer 142, the second conductive type clad layer 144 and the insulating layer 145.

The first electrode 146 is constituted with, for example, ITO or tin oxide ($SnO_2$) as similar to the sixth embodiment. The first electrode 146 functions as a p-side electrode.

The light emitting diode having such a constitution can be produced by, for example, the manner similar to the sixth embodiment. This light emitting diode functions as similar to the first embodiment and can be used similarly. Furthermore, according to this embodiment, in addition to the effect described for the first embodiment because each of the first conductive type clad layer 142 and the second conductive type clad layer 144 are constituted with an organic semiconductor, it can be produced at a lower temperature, and because the second conductive type clad layer 144 has a multi-layer structure to have an electrode layer, it is not necessary to newly form an n-side electrode comprising a metal or a metallic alloy, and thus the structure of the device and the production process can be simplified. This embodiment can be applied to the second to thirteenth embodiments.

(Fifteenth Embodiment)

Figure 19:
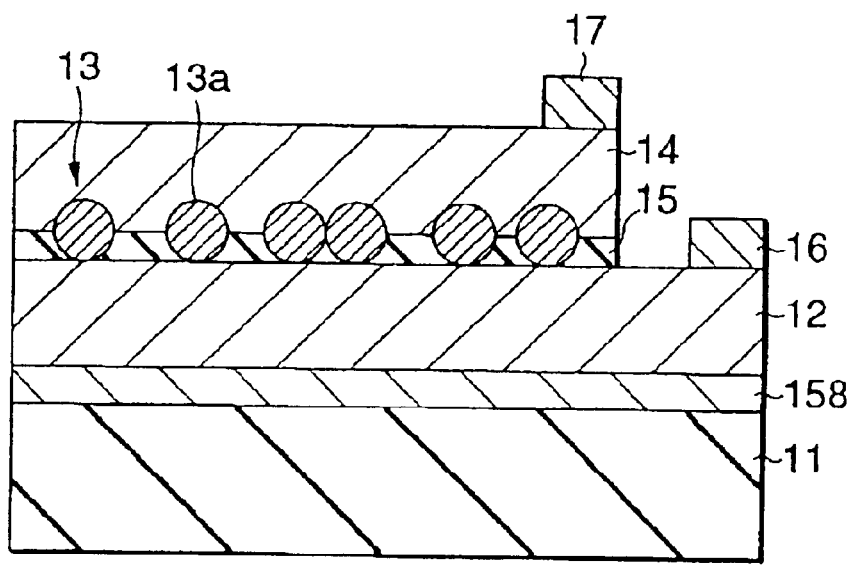
FIG. 19 is a cross sectional view showing the constitution of the light emitting diode of the fifteenth embodiment of the invention.

FIG. 19 is a cross sectional view showing the constitution of a light emitting diode of the fifteenth embodiment of the invention. This light emitting diode has the same constitution and is used in the similar manner as the first embodiment except that a diffusion preventing layer 158 is provided between a substrate 11 and a first conductive type clad layer 12. Therefore, the same symbols are attached to the same constitutional components herein, and the detailed descriptions therefor are omitted.

The diffusion preventing layer 158 is to prevent the diffusion of the constitutional elements between the substrate 11 and the first conductive type clad layer 12, and to increase the adhesion property between the substrate 11 and the first conductive type clad layer 12. The diffusion preventing layer 158, for example, has a thickness of several nm and is constituted with titanium nitride ($Ti_3N_4$) or silicon nitride ($Si_3N_4$).

This light emitting diode can be produced in the similar manner as in the first embodiment. The diffusion preventing layer 158 is formed by, for example, a sputtering method, a CVD method, a laser accumulation method or the like.

In this light emitting diode, when a prescribed voltage is applied between a first electrode 16 and a second electrode 17, an electric current is injected to microcrystals 13a in a light emitting layer 13, and emission of light occurs in the microcrystals 13a. Because the diffusion preventing layer 158 is provided herein, the diffusion of the constitutional elements between the substrate 11 and the first conductive type clad layer 12 is prevented, and the adhesion property between the substrate 11 and the first conductive type clad layer 12 is ensured. Accordingly, the product quality is maintained.

According to this embodiment, in addition to the effect described for the first embodiment, because the diffusion preventing layer 158 is provided, the diffusion of the constitutional elements between the substrate 11 and the first conductive type clad layer 12 can be prevented, and the adhesion property between the substrate 11 and the first conductive type clad layer 12 can be ensured. Accordingly, the product quality is maintained. This embodiment can be applied in the similar manner to the second to fourteenth embodiments.

(Sixteenth Embodiment)

Figure 20:
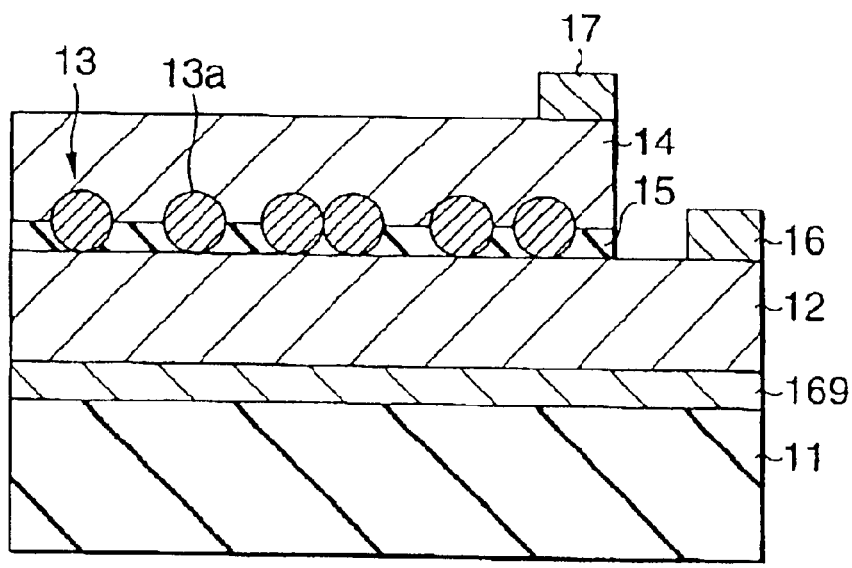
FIG. 20 is a cross sectional view showing the constitution of the light emitting diode of the sixteenth embodiment of the invention.

FIG. 20 is a cross sectional view showing the constitution of a light emitting diode of the sixteenth embodiment of the invention. This light emitting diode has the same constitution and is used in the similar manner as the first embodiment except that an auxiliary electrode 169 is provided between a substrate 11 and a first conductive type clad layer 12. Therefore, the same symbols are attached to the same constitutional components herein, and the detailed descriptions therefor are omitted.

The auxiliary electrode 169 functions as an auxiliary electrode to a first electrode 16, and has a role in that a voltage is uniformly applied to the whole surface of a light emitting layer 13. The auxiliary electrode 169, for example, has a thickness of 0.2 $\mu$m and is constituted with a conductive material such as tin oxide ($SnO_2$). In the case where the auxiliary electrode 169 is constituted with a material also having a diffusion preventing function such as tin oxide, the auxiliary electrode 169 also functions as a diffusion preventing layer.

This light emitting diode can be produced in the similar manner as in the first embodiment. The auxiliary electrode 169 is formed by, for example, a sputtering method, a CVD method, a vapor deposition method or the like.

In this light emitting diode, when a prescribed voltage is applied between the first electrode 16 and a second electrode 17, an electric current is injected to microcrystals 13a in a light emitting layer 13, and emission of light occurs in the microcrystals 13a. Because the auxiliary electrode 169 is provided herein, a voltage is uniformly applied to the whole surface of the light emitting layer 13. Accordingly, uniform emission of light occurs through the whole surface of the light emitting layer 13.

According to the light emitting diode of this embodiment, in addition to the effect described for the first embodiment, because the auxiliary electrode 169 is provided, a voltage is uniformly applied to the whole surface of the light emitting layer 13, and uniform emission of light occurs through the whole surface of the light emitting layer 13. This embodiment can be applied in the similar manner to the second to fifteenth embodiments.

(Seventeenth Embodiment)

Figure 21:
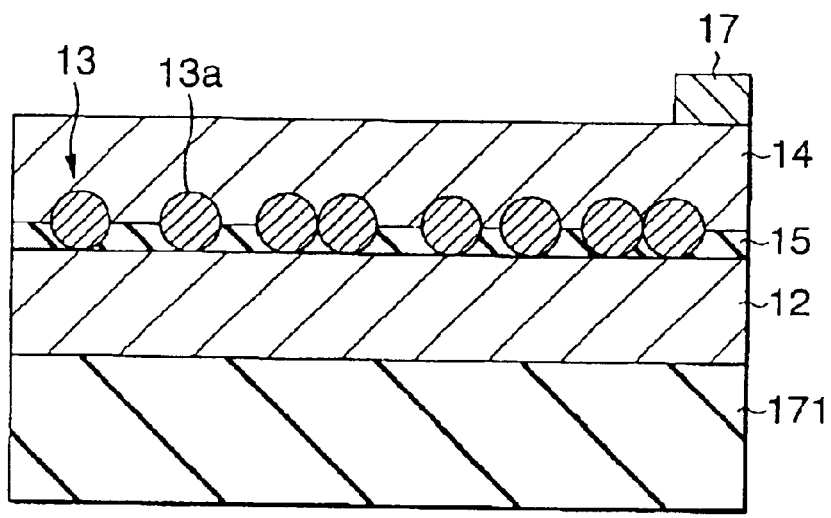
FIG. 21 is a cross sectional view showing the constitution of the light emitting diode of the seventeenth embodiment of the invention.

FIG. 21 is a cross sectional view showing the constitution of a light emitting diode of the seventeenth embodiment of the invention. This light emitting diode has the same constitution and is used in the similar manner as the first embodiment except that a substrate 171 is constituted with a conductive material to have a function as an n-side electrode, and a first electrode 16 is deleted. It can be produced in the similar manner as in the first embodiment. Therefore, the same symbols are attached to the same constitutional components herein, and the detailed descriptions therefor are omitted.

The substrate 171 is constituted with, for example, a conductive material, such as a metal, a semiconductor, silicon carbide (doped SiC) or the like. As the metal constituting the substrate 171, a high melting point metal, such as tungsten (W), tantalum (Ta) and the like, iron (Fe), and the like are preferred. This is because production at a high temperature can be conducted by the high melting point metal, and iron is inexpensive and easily available. It is preferred to constitute the substrate 171 with a metal since a device array of a large area can be formed. As the semiconductor constituting the substrate 171, silicon is preferred. This is because production at a high temperature can be conducted, and it is inexpensive and easily available. In the case where the substrate 171 is constituted with a semiconductor, one having a low resistance by adding an impurity (an n-type impurity herein) is used. Furthermore, in the case where the substrate 171 is constituted with a semiconductor or silicon carbide, either a single crystal body or a non-single crystal body may be used. However, it is preferred to constitute the substrate 171 with a non-single crystal body of a semiconductor or silicon carbide since they are easily available, production at a high temperature can be conducted, and a device array of a large area can be formed.

According to this embodiment, in addition to the effect described for the first embodiment, because the function of the first electrode (i.e., the n-side electrode) is given to the substrate 171, a voltage is uniformly applied to the whole surface of the light emitting layer 13 to make the whole surface of the light emitting layer 13 uniformly emitting light, and the production process can be simplified. In particular, when the substrate 171 is constituted with iron or the like, a device array of a large area can be formed at a low cost. When the substrate 171 is constituted with silicon, silicon carbide or the like, stable production can be conducted at a high temperature with a low cost. Furthermore, when the substrate 171 is constituted with a non-single crystal body of silicon or silicon carbide, a device array of a large area can be formed. This embodiment can be applied in the similar manner to the second to fifteenth embodiments.

(Eighteenth Embodiment)

Figure 22:
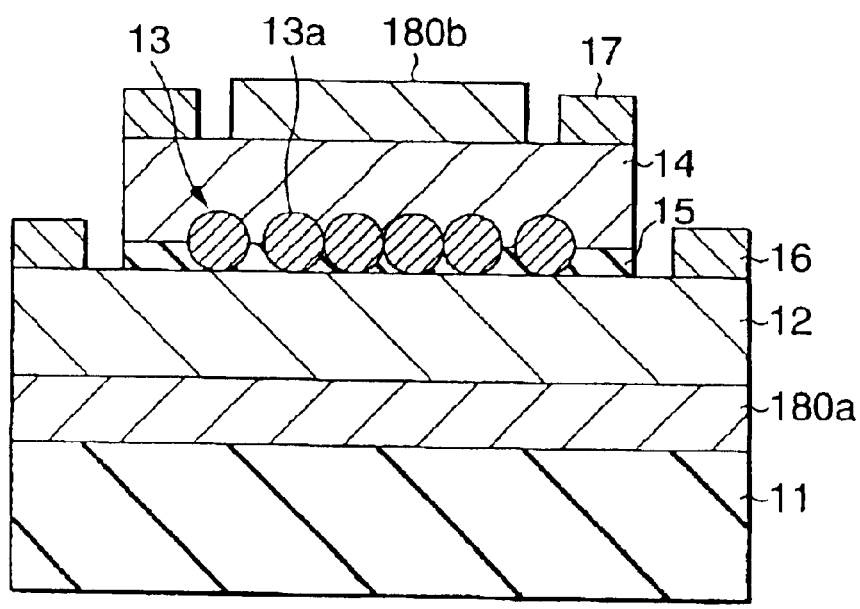
FIG. 22 is a cross sectional view showing the constitution of the semiconductor laser of the eighteenth embodiment of the invention.

FIG. 22 is a cross sectional view showing the constitution of a semiconductor laser (laser diode, LD) of the light emitting device of the eighteenth embodiment of the invention. The semiconductor laser has the same constitution and effect as the light emitting diode according to the first embodiment except that a pair of reflectors 180a and 180b is provided. Therefore, the same symbols are attached to the same constitutional components herein, and the detailed descriptions therefor are omitted.

The reflector 180a is formed between a substrate 11 and a first conductive type clad layer 12, and the reflector 180b is formed on a second conductive type clad layer 14 on the side opposite to the substrate 11. While not shown herein, the reflectors 180a and 180b are constituted by laminating alternately one or more layers of a low refractive index layer and a high refractive index layer, or constituted with one of them. The reflectivities of the reflectors 180a and 180b are controlled by the number of lamination of the low refractive index layer and the high refractive index layer, and the reflectivity of the reflector 180a is high but the reflectivity of the reflector 180b is low. That is, light amplified by going back and forth between the pair of the reflectors 180a and 180b is emitted from the reflector 180b toward the outside. Examples of the material constituting the low refractive index layer include silicon dioxide ($SiO_2$), calcium fluoride (CaF), magnesium fluoride ($MgF_2$) and the like, and examples of the material constituting the high refractive index layer include cerium oxide ($CeO_2$), zinc sulfide (ZnS), hafnium oxide ($HfO_2$), tantalum oxide ($TaO_2$) and the like.

This semiconductor laser can be produced in the similar manner as in the first embodiment. The reflectors 180a and 180b are formed by, for example, a sputtering method, a CVD method or the like.

In this semiconductor laser, when a prescribed voltage is applied between a first electrode 16 and a second electrode 17, an electric current is injected to microcrystals 13a in a light emitting layer 13, and emission of light occurs in the microcrystals 13a. The light emitted from the light emitting layer 13 is amplified by going back and forth between the pair of the reflectors 180a and 180b, and emitted from the reflector 180b toward the outside.

As shown herein, the invention can be applied to not only a light emitting diode but also a semiconductor laser. This embodiment can be applied to not only the first embodiment but also the second to seventeenth embodiments.

While the invention has been described with reference to the embodiments, the invention is not limited to the embodiments, and various modifications are possible. For example, in the embodiments described above, while the first conductive type clad layer, the light emitting layer, the second conductive type clad layer and the insulating layer have been described with reference to the specific examples of the materials constituting them, the invention can be constituted with other materials. For example, the light emitting layer may be constituted with another II–VI group compound semiconductor containing at least one of a II group element selected from the group consisting of zinc, magnesium, cadmium (Cd), manganese (Mn), mercury (Hg) and beryllium (Be), and at least one of a VI group element selected from the group consisting of oxygen, selenium (Se), sulfur (S) and tellurium (Te), or a III–V group compound semiconductor containing at least one of a III group element selected from the group consisting of boron, aluminum, gallium and indium, and at least one of a V group element selected from the group consisting of nitrogen, phosphorous (P), arsenic (As), antimony (Sb) and bismuth (Bi).

Furthermore, while the cases where the microcrystals of the light emitting layer are formed in substantially one layer in the lamination direction have been described in the embodiments described above, it may be formed by stacking to two or more layers.

Furthermore, in the first to fifth, eleventh and fifteenth to eighteenth embodiments, while the cases where the first conductive type clad layer is n-type, and the second conductive type clad layer is p-type have been described, it may be possible that the first conductive type clad layer is p-type, and the second conductive type clad layer is n-type. In the sixth to tenth and twelfth to fourteenth embodiments, while the case where the first conductive type clad layer is p-type, and the second conductive type clad layer is n-type have been described, it may be possible that the first conductive type clad layer is n-type, and the second conductive type clad layer is p-type.

Furthermore, in the first to fifth, eleventh and fifteenth to eighteenth embodiments, while the cases where each of the first conductive type clad layer and the second conductive type clad layer are constituted with a non-single crystal inorganic semiconductor have been described, only one of them may be constituted with a non-single crystal inorganic semiconductor. Alternatively, both of them may be constituted with a non-single crystal inorganic semiconductor.

Furthermore, in the sixth to tenth and twelfth to fourteenth embodiments, while the cases where each of the first conductive type clad layer and the second conductive type clad layer are constituted with an organic semiconductor or a conductive resin have been described, only one of the first conductive type clad layer and the second conductive type clad layer may be constituted with an organic semiconductor or a conductive resin. Alternatively, each of the first conductive type clad layer and the second conductive type clad layer may be constituted with an organic semiconductor, or each of them may be constituted with a conductive resin. One of the first conductive type clad layer and the second conductive type clad layer may be constituted with an organic semiconductor, and the other may be constituted with a conductive resin. Furthermore, in the case where each of the first conductive type clad layer and the second conductive type clad layer are constituted with an organic semiconductor, they may be constituted with the same kind of an organic semiconductor, or may be constituted with different kinds of organic semiconductors.

Furthermore, in the twelfth to fourteenth embodiments, while the cases where at least one of the first conductive type clad layer and the second conductive type clad layer has a multi-layer structure comprising an organic semiconductor have been described, at least a part of the multi-layer structure may be constituted with a conductive resin.

Furthermore, in the eleventh to thirteenth embodiments, while the cases where each of the first conductive type clad layer and the second conductive type clad layer have a multi-layer structure have been described, only one of them may have the multi-layer structure.

Furthermore, in the eleventh to fourteenth embodiments, while the cases where the first conductive type clad layer or the second conductive type clad layer has a multi-layer structure of two layers have been described, it may have a multi-layer structure of three or more layers. In this case, when the layer nearer the light emitting layer has a smaller band gap, the light emission efficiency can be increased as similar to the eleventh and twelfth embodiments. Further, in addition to the plural layers laminated in such a manner that the layer nearer the light emitting layer has a smaller band gap, it may have at least one of an adhesion layer and an electrode layer.

Furthermore, in the thirteenth and fourteenth embodiments, while the cases where the adhesion layer or the electrode layer is formed in the second conductive type clad layer have been described, it is possible that the adhesion layer or the electrode layer is formed in the first conductive type clad layer.

Furthermore, in the embodiments, while the cases where the insulating layer is provided between the first conductive type clad layer and the second conductive type clad layer have been described, the insulating layer may not be provided in the case where a leaking electric current between the first conductive type clad layer and the second conductive type clad layer does not form any problem, or the like.

Furthermore, as described for the first embodiment, in the case where the light emitting layer is formed by coating the plural microcrystals dispersed in a solvent, when a substance that becomes an insulating film after a firing treatment, such as SOG (spin on glass), is used as the solvent, the formation of the insulating layer may be easy.

As described in the foregoing, according to the light emitting device described in one of claims 1 to 25, because the microcrystalline layer formed between the first conductive type layer and the second conductive type layer contains plural microcrystals having an improved crystallinity, the light emission efficiency can be increased, and the service life of the device can be prolonged. Because the lattice matching and the like need not be considered, an arbitrary material can be selected depending on the wavelength of emitting light. Furthermore, because the band gap is broadened with a smaller particle diameter due to the particle size effect, the wavelength of emitted light can be short wavelength, and light emission in an ultraviolet region can be obtained by selecting the material constituting the microcrystalline layer. Accordingly, it can be also used as a light source of a sterilization lamp or the like. Additionally, because it is not necessary to constitute the first conductive type layer and the second conductive type layer with a single crystal inorganic semiconductor, the range of selection of the materials constituting them is broadened, and they may be constituted with a non-single crystal inorganic semiconductor, an organic semiconductor or a conductive resin, which brings about an effect in that it can be easily formed at a low temperature.

In particular, according to the light emitting device described in claim 4, because the microcrystalline layer contains two or more kinds of microcrystals comprising different semiconductors, an effect of obtaining plural kinds of light of different wavelength is exhibited.

Furthermore, according to the light emitting device described in claim 5, because the microcrystals have a layered structure, an effect is exhibited in that the light emission efficiency is further increased.

Furthermore, according to the light emitting device described in claim 6 or claim 11, because at least one of the first conductive type layer and the second conductive type layer is constituted with at least one of a non-single crystal body or an organic semiconductor and a conductive resin, an effect is exhibited in that it can be easily produced at a low temperature.

Furthermore, according to the light emitting device described in claim 13, because at least one of the first conductive type layer and the second conductive type layer has plural layers, in which the layer nearer the microcrystalline layer has a smaller band gap, an effect is exhibited in that the light emission efficiency is further increased.

Furthermore, according to the light emitting device described in claim 14, because at least one of the first conductive type layer and the second conductive type layer has an adhesive layer, an effect is exhibited in that the adhesion property of the electrode is increased.

Furthermore, according to the light emitting device described in claim 15, because at least one of the first conductive type layer and the second conductive type layer has an electrode layer, an effect is exhibited in that it is not necessary to newly form an electrode comprising a metal or an alloy, and the device structure and the production process can be simplified.

Furthermore, according to the light emitting device described in one of claims 16 to 19, because an insulating layer is provided among the microcrystals in the microcrystalline layer, the leaking electric current between the first conductive type layer and the second conductive type layer can be decreased, and an electron and a hole can be effectively injected to the microcrystals. Therefore, an effect is exhibited in that the light emission efficiency can be increased.

Furthermore, according to the light emitting device described in claim 21, because the substrate is constituted with an amorphous body or plastics, an effect is exhibited in that the area of the substrate can be easily broadened, and a device array of a large area can be obtained.

Furthermore, according to the light emitting device described in claim 22, because the substrate is constituted with a metal, a semiconductor or silicon carbide, an effect is exhibited in that a voltage can be uniformly applied to the whole surface of the microcrystalline layer to conduct uniform light emission on the whole surface of the microcrystalline layer, and the production process can be simplified. Moreover, an effect is also exhibited in that the area of the substrate can be easily broadened to form a device array of a large area.

Furthermore, according to the light emitting device described in claim 23, because a diffusion preventing layer is provided between the substrate and the first conductive type layer, an effect is exhibited in that the diffusion of the constitutional elements between the substrate and the first conductive type layer can be prevented to increase the product quality.

Furthermore, according to the light emitting device described in claim 24, because an auxiliary electrode is provided between the substrate and the first conductive type layer, an effect is exhibited in that a voltage can be uniformly applied to the whole surface of the microcrystalline layer to conduct uniform light emission on the whole surface of the microcrystalline layer.

Furthermore, according to the light emitting device described in claim 26, because the light emitting layer formed between the first conductive type clad layer and the second conductive type clad layer contains plural microcrystals, the same effect as the light emitting device described in one of claims 1 to 25 is exhibited. Moreover, because an insulating layer is provided between the first conductive type clad layer and the second conductive type clad layer, the same effect as the light emitting device described in one of claims 16 to 19 is exhibited.

Furthermore, according to the process for producing a light emitting device described in one of claims 27 to 43, because it comprises a step of forming a first conductive type layer, a step of forming a microcrystalline layer thereto, and a step of forming a second conductive type layer on the first conductive type layer through the microcrystalline layer, an effect is exhibited in that the light emitting device according to the invention can be easily produced, and the light emitting device according to the invention can be easily realized.

In particular, according to the process for producing a light emitting device described in one of claims 29 to 34, because after forming the microcrystalline layer, a heat treatment is conducted in an atmosphere containing oxygen, an atmosphere containing nitrogen or an atmosphere containing hydrogen, an effect is exhibited in that the crystallinity of the microcrystals can be increased.

Furthermore, according to the process for producing a light emitting device described in claim 35 or claim 36, because at least one of the first conductive type layer and the second conductive type layer is formed with at least one of a non-single crystal inorganic semiconductor or organic semiconductor and a conductive resin, an effect is exhibited in that it can be easily produced at a low temperature.

Furthermore, according to the process for producing a light emitting device described in claim 38 or 39, because after forming the first conductive type layer, the surface thereof is oxidized or nitrided, an effect is exhibited in that an insulating layer is easily formed, and the light emitting device according to the invention can be easily realized.

Furthermore, according to the process for producing a light emitting device described in claim 44, because it comprises a step of forming a first conductive type clad layer, a step of forming a light emitting layer, a step of forming an insulating layer, and a step of forming a second conductive type clad layer, an effect is exhibited in that the light emitting device according to the invention can be easily produced, and the light emitting device according to the invention can be easily realized.

What is claimed is:

1. A light emitting device, comprising:
   a first conductive type clad layer formed of an organic material;
   a second conductive type clad layer formed of an organic material having a conductivity that is different than a conductivity of the first conductive type clad layer; and
   a layer of microcrystals between the first conductive type clad layer and the second conductive type clad layer;
   wherein each of the microcrystals comprises an inorganic semiconductor body containing at least one of nitrogen and oxygen.

2. A light emitting device as described in claim 1, where at least one of the first conductive type clad layer and the second conductive type clad layer comprises at least one of organic semiconductor and a conductive resin.

3. A light emitting device as described in claim 2, where the organic semiconductor comprises at least one of a π-conjugated polymer complex, a polymer silicone derivative, and a polymer metallic complex.

4. A light emitting device as described in claim 1, where at least one of the first conductive type clad layer and the second conductive type clad layer has a multi-layer structure.

5. A tight emitting device as described in claim 1, wherein the microcrystals is at least one of a zinc-oxide, gallium nitride, and indium nitride.

6. A light emitting device as described in claim 1, further comprising a substrate made of at least one of a metal, a semiconductor, and silicon carbide.

7. A light emitting device as described in claim 6, further comprising a diffusion preventing layer between the first conductive type clad layer and the substrate.

8. A light emitting device as described in claim 6, further comprising an auxiliary electrode between the first conductive type clad layer and the substrate.

9. A light emitting device as described in claim 1, further comprising a pair of reflectors forming a cavity.

* * * * *